United States Patent
Krajewski

(10) Patent No.: US 11,616,154 B2
(45) Date of Patent: Mar. 28, 2023

(54) PLANARIZATION OF PHOTOVOLTAICS

(71) Applicant: UTICA LEASECO, LLC, Rochester Hills, MI (US)

(72) Inventor: Todd Krajewski, Mountain View, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 650 days.

(21) Appl. No.: 16/585,436

(22) Filed: Sep. 27, 2019

(65) Prior Publication Data

US 2020/0028010 A1     Jan. 23, 2020

Related U.S. Application Data

(62) Division of application No. 16/005,289, filed on Jun. 11, 2018, now abandoned.

(51) Int. Cl.
    *H01L 31/18*            (2006.01)
    *H01L 31/0475*       (2014.01)
    (Continued)

(52) U.S. Cl.
    CPC .... *H01L 31/0475* (2014.12); *H01L 31/02008* (2013.01); *H01L 31/0256* (2013.01); *H01L 31/05* (2013.01); *H01L 31/18* (2013.01)

(58) Field of Classification Search
    CPC ........... H01L 31/0475; H01L 31/02008; H01L 31/0256; H01L 31/05; H01L 31/18; H01L 31/0481; Y02E 10/50
See application file for complete search history.

(56) References Cited

U.S. PATENT DOCUMENTS 4,497,974 A    2/1985   Deckman et al.
8,592,679 B2*   11/2013   Patel ................ B32B 17/10018
                                                 136/251

(Continued)

FOREIGN PATENT DOCUMENTS

| EP | 0864623 A1 | 9/1998 |
|---|---|---|
| WO | 2012081243 A1 | 6/2012 |
| WO | 2013048240 A1 | 4/2013 |

OTHER PUBLICATIONS

International Search and Written Opinion corresponding to International Application No. PCT/US2019/022979, dated Aug. 13, 2019.

*Primary Examiner* — Bitew A Dinke
(74) *Attorney, Agent, or Firm* — ArentFox Schiff LLP

(57) ABSTRACT

Various processes can apply pressure and/or heat to a photovoltaic (PV) layer, including processes that integrate solar cells into different types of industrial glass such as an autoclave lamination process. The disclosure describes a planarization technique that can be used on the PV layer to eliminate point loads caused by such processes. In an aspect, a method for producing a component is described that includes disposing or placing a planarization material on a PV layer, modifying a physical form of the planarization material to provide a planar surface made of the planarization material on one side of the PV layer having surface irregularities, and forming a stack of layers (e.g., as part of an autoclave lamination process) for the component by disposing a first layer over the planar surface on the one side of the PV layer and a second layer over the other, opposite side of the PV layer.

20 Claims, 21 Drawing Sheets

(51) Int. Cl.
*H01L 31/02* (2006.01)
*H01L 31/0256* (2006.01)
*H01L 31/05* (2014.01)

(56) References Cited

U.S. PATENT DOCUMENTS

| | | | |
|---|---|---|---|
| 9,362,434 B2 * | 6/2016 | Yasukawa | B32B 27/308 |
| 2001/0050815 A1 | 12/2001 | Ishihara et al. | |
| 2003/0010376 A1 | 1/2003 | Yamaguchi et al. | |
| 2003/0161997 A1 | 8/2003 | Moran | |
| 2004/0089338 A1 | 5/2004 | Kukulka | |
| 2004/0182432 A1 * | 9/2004 | Yoda | H01L 31/0488 136/251 |
| 2008/0223433 A1 * | 9/2008 | Hanoka | H01L 31/048 136/251 |
| 2011/0036390 A1 * | 2/2011 | Nelson | B32B 17/10036 438/66 |
| 2012/0266943 A1 * | 10/2012 | Li | H01L 31/0481 438/66 |
| 2012/0285536 A1 * | 11/2012 | Ishiguro | H01L 31/0481 136/259 |
| 2013/0160813 A1 * | 6/2013 | Natarajan | H01L 31/049 438/66 |
| 2013/0180578 A1 | 7/2013 | Ravi et al. | |
| 2014/0041714 A1 * | 2/2014 | Van Den Berg | H01L 31/048 438/93 |
| 2014/0083487 A1 * | 3/2014 | Santoleri | H01L 31/049 264/510 |
| 2014/0090708 A1 * | 4/2014 | Kang | H01L 31/049 136/259 |
| 2014/0190545 A1 * | 7/2014 | Lei | H01L 31/049 156/244.11 |
| 2014/0290722 A1 * | 10/2014 | Sakuma | B32B 15/20 136/251 |
| 2014/0311555 A1 * | 10/2014 | Harkema | H01L 31/0481 136/251 |
| 2015/0129013 A1 * | 5/2015 | Nositschka | B62D 29/043 438/66 |
| 2015/0136207 A1 * | 5/2015 | Giron | B32B 17/10788 438/66 |
| 2015/0221813 A1 * | 8/2015 | Kim | B32B 27/08 438/67 |
| 2017/0133537 A1 * | 5/2017 | Liu | H01L 31/0516 |
| 2018/0047863 A1 * | 2/2018 | Jeon | B32B 27/32 |
| 2018/0358492 A1 * | 12/2018 | Ueda | H01L 31/048 |
| 2019/0140121 A1 * | 5/2019 | Ueda | H01L 31/048 |
| 2019/0371952 A1 * | 12/2019 | Zhou | H01L 31/0504 |
| 2019/0378943 A1 * | 12/2019 | Krajewski | H01L 31/0481 |
| 2020/0350448 A1 * | 11/2020 | Santoleri | B29C 48/08 |
| 2021/0020586 A1 * | 1/2021 | Krajewski | H01L 23/562 |
| 2021/0249549 A1 * | 8/2021 | Gaume | C08J 5/244 |

* cited by examiner

PLANARIZATION OF PHOTOVOLTAICS

CROSS-REFERENCE TO RELATED APPLICATIONS

The present application is a Divisional application of U.S. Non-Provisional patent application Ser. No. 16/005,289, entitled "Planarization of Photovoltaics," filed on Jun. 11, 2018, the disclosure of which is hereby incorporated in its entirety by reference.

TECHNICAL FIELD

This disclosure relates to the planarization of photovoltaic layers, and in particular, to the use of various materials, structures, devices, and processes that enable the incorporation of photovoltaics into components produced by different lamination processes.

BACKGROUND

Photovoltaics or PVs are optoelectronic devices that are made of semiconductor materials that exhibit the photovoltaic effect, that is, materials that produce a voltage and/or electric current when exposed to light. In some applications, photovoltaics (also referred to cells of a PV (PV cells) or also as solar cells) are disposed, placed, or fabricated in at least one of the layers in a stack of layers that form an optoelectronic system or component. A layer with photovoltaics may be referred to as a PV layer. The topography or surface of the PV layer is typically not flat or planar as it can contain various types of surface irregularities, including but not limited to front (or back) metallization, tabs, connectors, busbars, joints, or other like structures that protrude from the surface of the PV layer or form depressions on the surface of the PV layer, causing the PV layer surface to be uneven in certain spots.

For certain industrial applications, an optoelectronic system or component, and therefore the PV layer that is part of that component, can be embedded, integrated, or incorporated between layers of a rigid material (e.g., glass) for lamination. One of the processes (but not the only one) that is used for making industrial components with integrated PV layers is the autoclave lamination process. This process includes an initial "de-airing" step that can place a structure having a PV layer into compression with pressure (e.g., 1 bar) before any heating is applied. The autoclave lamination process itself can provide pressurization (e.g., greater than 10 bar) simultaneously with heating. In both instances (e.g. during "de-airing" or autoclave lamination), the PV layer can be subjected to localized point loads because of the uneven topography or surface of the PV layer. This can lead to certain defects such as cracking and/or shunting in the PV layer, which can reduce the performance and/or reliability of the optoelectronic component, and can also negatively impact the production yield rate.

SUMMARY OF THE DISCLOSURE

Figure 1A:
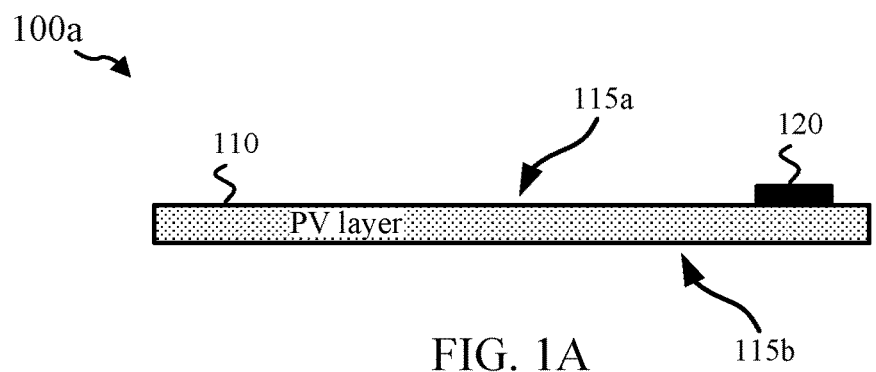
FIG. 1A illustrates an example of a PV layer.

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect, a PV layer including a PV cell, or a string or array of PV cells, and which may also include interconnect structures and in-laminate diodes, is planarized through the use of a coating or layer (e.g., epoxy, silicone), vacuum lamination of a thin thermoplastic (e.g., polyvinyl butyral (PVB), thermoplastic poly olefin (TPO)) or thermoset film (e.g., ethylene vinyl acetate (EVA)), or other similar technique (e.g., roll lamination, atmospheric plate press). By planarizing uneven portions of the surface of the PV layer, it may be possible to eliminate regions that can act as point loads (such as protrusions and/or depressions) when exposed to pressure during a typical lamination production process (e.g., autoclave lamination process). As such, active optoelectronic systems or components can be integrated or incorporated into industrial rigid structures (e.g., glass structures), for example, including curved or non-planar structures.

In another aspect, a method for producing a component (e.g., an optoelectronic component) is described that includes disposing or placing a planarization material on the PV layer, modifying a physical form of the planarization material to provide a planar surface made of the planarization material on one side of the PV layer having surface irregularities; and forming a stack of layers for the component by disposing a first layer over the planar surface on the one side of the PV layer and a second layer over the other, opposite side of the PV layer. The first layer and the second layer can be rigid layers used for lamination (e.g., glass layers).

In yet another aspect, a light-capturing component is described that includes a PV layer, a planarization material disposed on one side of the PV layer having surface irregularities to provide a planar surface made of the planarization material, a first layer disposed over the planar surface on the one side of the PV layer, and a second layer disposed over the other, opposite side of the PV layer. The PV layer with the planarization material, the first layer, and the second layer form a stack of layers for the light-capturing component. Moreover, the first layer and the second layer can be rigid layers used for lamination (e.g., glass layers).

DETAILED DESCRIPTION

This disclosure describes various materials, structures, devices, and processes that enable the incorporation of photovoltaics into different lamination processes. In particular, this disclosure describes techniques for planarization of PV layers to eliminate the localized point loads caused by the uneven topography of the PV layer. As used herein the terms "photovoltaics," "PVs," "PV cells," and "solar cells" may be used interchangeably to refer to one or more portions of an optoelectronic system or component that produce voltage and/or electric current when exposed to light. It is also to be understood that a reference to a single "photovoltaic," "PV," "PV cell," and "solar cell" may also refer to instances of multiples of such devices or structures, including instances in which the multiples of such devices or structures are interconnected in a string or array. A PV layer may refer to a layer (e.g., epitaxial layer, semiconductor layer) that includes one or more photovoltaics, PVs, PV cells, and/or solar cells.

In one example, multiple PV cells can be fabricated, formed, or otherwise assembled on a substrate to produce a PV layer. The different cells (e.g., PV cells or solar cells) of the PV layer can be coupled together via shingling (e.g., to form strings) or an interconnect disposed upon the surface (e.g., front-side or back-side) of the PV layer. The shingling or placement of the interconnect (as well as contacts) results in one or more protrusions from the surface of the PV layer (e.g., the PV layer does not have a planar surface). Eventually, the PV layer is assembled among a stack of other layers, which may include glass (or other laminates) as well as intermediate layers between the PV layer and the glass. Because the resulting structure of the PV layer has one or more surfaces that are non-planar (e.g., locally non-planar or uneven) from surface irregularities (e.g., protrusions and/or depressions) that can cause point loads during a fabrication processing (e.g., autoclave lamination), applied forces (e.g., pressure) that are incidental to the fabrication process can be localized around the irregularities. If the applied force is too strong, then the PV layer can crack or be otherwise damaged, rendering one or more PV cells in the PV layer useless. Therefore the performance and/or reliability of the optoelectronic component is reduced as a result of the point loads caused by the surface irregularities. This can have a negative impact on the yield rate of the production of optoelectronic component as well.

To eliminate or reduce the incidence of cracking on the PV layer, the PV layer can be at least partially embedded or covered by a material (e.g., a planarization material) to create one or more planar surfaces on the PV layer. For example, the PV layer and an interconnect that protrudes from a surface of the PV layer can be embedded within a layer of another material such as a thermoplastic. Thus, when a stack of layers that form an optoelectronic component and include the at least partially embedded PV layer is then subjected to the vacuum or when the optoelectronic component is laminated/autoclaved, for example, the force that is applied on the PV layer as part of these fabrication processes is distributed across the planarized surface of the PV layer and its interconnect rather than localized around a smaller region where the interconnect is located. As a result, cracking (and/or shunting) of the PV layer that would otherwise result near the location of the interconnect can be eliminated or at least reduced.

The planarization of surface irregularities of the PV layer (e.g., protrusion(s) and/or depression(s)) can be performed by placing the PV layer with its surface irregularities between two layers of planarization material to form a stack of layers. In some instances, planarization of the PV layer may be performed using a single layer of planarization material. The planarization materials can include thermoplastics or thermoset films. The stack of layers can then be disposed within a vacuum structure (e.g., a vacuum bag, chamber, or gasket) with a heat source. Air or gas that is in the layers can be pumped out to create a vacuum, and the heat source can heat the planarization material, causing the planarization material to begin to soften and changes its form. Force can then be applied to the side of the stack opposite from where the heat source is to allow for the planarization material to mold or deform around the PV layer such that the PV layer and its surface irregularities are at least partially covered, suspended, or disposed within the resulting planarization material. That is, the planarization material's physical form is changed (e.g., through heat and/or pressure) to encapsulate at least part of the PV layer and its surface irregularities in order to produce one or more planar surfaces made of the planarization material. This planarized PV layer, which now has one or more planar surfaces as a result of being at least partially embedded in the planarization material, can then be used to assemble an optoelectronic system.

This disclosure describes a solution to the problem of cracking and/or shunting caused by localized point loads on a PV layer when processed during different fabrication processes, including autoclaving lamination processes. This solution, through the planarization of the PV layer to eliminate or reduce point loads, allows for the integration of optoelectronic components (e.g., solar cells) into industrial gas application, for example, while using standard production or fabrication processes. This is particularly important for applications where the rigid lamination material (e.g., glass) may be curved, as autoclaving lamination is the most practical, and in some cases, only production process that is viable for those types of shapes. Moreover, the structures and techniques disclosed herein in connection with making planarized PV layers can increase the yield rate of the production of PVs for various applications, including industrial glass lamination applications.

FIG. 1A illustrates a diagram 100a showing a structure that includes a PV layer 110 having a protrusion 120 on a first surface 115a. As shown, the PV layer 110 does not have a protrusion or any other surface irregularity (e.g., electrical and/or mechanical components of PV cells) on a second surface 115b. The protrusion 120 can be representative any number of surface irregularities in a PV layer 110, for example, the protrusion 120 can represent a busbar providing an interconnect between different PV cells in the PV layer 110, allowing for the flow of current from the different PV cells. Other surface irregularities that can create a protrusion include contacts (e.g., metal contacts upon the surface of the PV layer 110), tabs (e.g., thinner or narrower forms of busbars that reduce shading of the PV cells), and the like. Though the protrusion 120 is shown on a top side of the PV layer 110 (on the first surface 115a), the protrusion 120 can also be on a bottom side of the PV layer 110 (on the second surface 115b), or there could be instances in which there are protrusions 120 on both sides of the PV layer (on the first surface 115*a* and on the second surface 115*b*). Moreover, while a single protrusion 120 is shown, this is merely for illustration purposes, a single protrusion 120 can be representative of multiple protrusions whether they are topographically next to each other or not. It is to be understood that the terms "top side" and "bottom side" as used in this context are intended to indicate the position of the protrusion 120 in connection with the structure shown in the diagram 100*a* of FIG. 1A and are not intended to provide an indication of whether a side is a light-facing side or not.

The PV layer 110 can include cells (e.g., PV cells) made of semiconductor materials including one or more of gallium arsenide (GaAs), copper indium gallium selenide (also known as CIGS), cadmium telluride (CdTe), perovskites, silicon (Si), or other materials that exhibit the photovoltaic effect in which voltage and/or electric current are generated in a semiconductor material upon exposure to light. This can also include thin film photovoltaic (or solar) cells that are made by depositing thin layers of material on a substrate (e.g., a Si, GaAs, aluminum foil, steel, etc. substrates).

In an example, the PV layer 110 can include a thin film PV material on which the PV cells are made or embedded, where the thin film PV material can be one or more of CdTe, CIGS, amorphous thin-film silicon (a-Si), GaAs, or perovskites. The PV layer 110 may include crystalline silicon (c-Si) made of multicrystalline silicon or monocrystalline silicon. Moreover, the PV layer 100 may include PV cells made of a heterojunction with intrinsic thin layer (HIT) structure having a thin crystalline silicon layer surrounded by one or more ultra-thin amorphous silicon layers. In some instances, the PV layer 110 may be made of flexible PV cells to allow the PV layer 110 to conform to different shapes. For example, the PV layer 110 can be a flexible thin film made by an epitaxial lift-off (ELO) process, etching, proton induced exfoliation, or other similar process.

As described above, a PV layer can be one of the layers in a stack of layers that form an optoelectronic system or component. The optoelectronic component along with the PV layer can be embedded, integrated, or incorporated between layers of a rigid material (e.g., glass) for lamination and to produce an industrial component or product that can be used in a wide range of applications.

One of the processes that is used for making industrial components with integrated PV layers is the autoclave lamination process. The autoclave lamination process (and similar processes) can include an initial or first step, generally referred to as a "de-gassing" step in which vacuum is applied to remove gas from the sample (e.g., assembled stack of layers) being processed—layers of the stack are subjected to up to 1 bar of pressure as a result. The "de-gassing" step can also include some form of heating, where, for example, the sample goes into an oven (e.g., a conveyor furnace) and is heated up to 75-80 degrees Celsius (° C.). The "de-gassing" step therefore reduces moisture and gases within the layers of the stack and adheres the layers together. In some instances, the "de-gassing" step can be a standalone step that need not be performed in connection with an autoclave lamination process or any other similar lamination process. FIGS. 1B-1E illustrate examples of different structures in which a PV layer cracks (or shunts) due to forces being applied to an uneven or non-planar topography of the PV layer while a "de-gassing" or similar vacuum step is being performed.

Figure 1B:
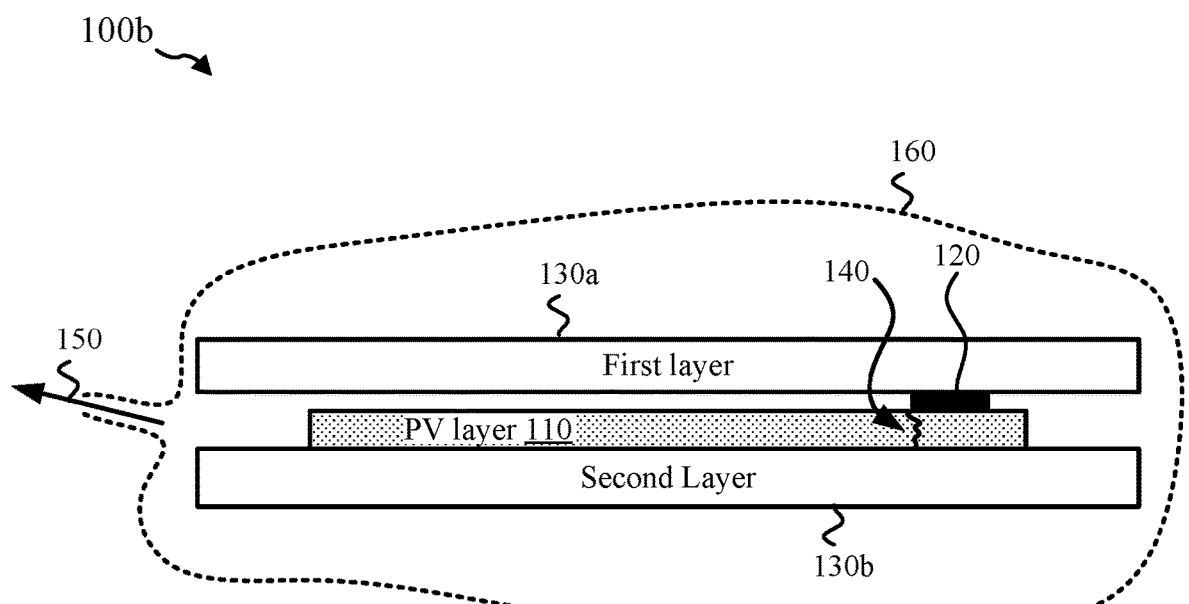
FIGS. 1B-1E illustrate examples of different structures with a PV layer cracking due to the topography of the PV layer.

FIG. 1B shows a diagram 100*b* in which a stack of layers (e.g., at least part of an optoelectronic component) is subjected to additional processing after being assembled. In this case, the stack is placed inside a vacuum structure 160 to perform a "de-gassing" or similar step. The vacuum structure 160 can be a vacuum bag (e.g., Teflon bag, polytetrafluoroethylene (PTFE) bag) or some form of vacuum container that is used to pull vacuum and remove gas or air 150 from the stack of layers. FIG. 1E, which is described in more detail below, shows an example in which the vacuum structure 160 is instead a gasket placed around the stack of layers that includes the PV layer 110.

In the example of FIG. 1B, the stack of layers includes the PV layer 110 with the protrusion 120, as well as a first layer 130*a* disposed or placed over the PV layer 110 and a second layer 130*b* disposed or placed below the PV layer 110. In other words, the PV layer 110 is placed between or is "sandwiched" by the first layer 130*a* and the second layer 130*b*. The first layer 130*a* and the second layer 130*b* need not be of the same thickness; however, the first layer 130*a* and the second layer 130*b* may generally be of the same size and may have their edges substantially aligned.

The first layer 130*a* and the second layer 130*b* can be planar layers that provide rigidity and/or to protect the other layers in the stack from damage to due mechanical abrasion and/or environmental exposure. In a typical industrial or commercial application, the first layer 130*a* and the second layer 130*b* are planar layers made of glass or other similarly rigid, transparent material. In other applications, the first layer 130*a* and the second layer 130*b* can instead be non-planar or non-uniform layers. For example, the first layer 130*a* and the second layer 130*b* may be curved.

Materials other than glass can also be used for the first layer 130*a* and the second layer 130*b*. For example, polycarbonate can be used instead of glass for the first layer 130*a*, while steel, aluminum, carbon fiber composites, fiber glass, engineered thermoplastics, and reinforced thermoplastics can be used instead of glass for the second layer 130*b*. In an aspect, the first layer 130*a* may be a top laminate layer associated with the front or light receiving side of the PV layer 110, while the second layer 130*b* may be bottom laminate layer associated with a back or dark side of the PV layer 110.

As described above, the first layer 130*a* and the second layer 130*b* can be made of rigid materials. The rigidity associated with the first layer 130*a* and the second layer 130*b* can be greater than the rigidity associated with the PV layer 110. A greater rigidity in this case can refer to a greater stiffness based on, for example, Young's modulus. In some examples, the rigidity associated with the first layer 130*a* can be different than the rigidity associated with the second layer 130*b*.

When vacuum is pulled and air/gas 150 is removed from the stack of layers inside the vacuum structure 160, forces are applied to the first layer 130*a* and the second layer 130*b* of the stack. The application of forces on the first layer 130*a* and the second layer 130*b* in turn applies a force on the protrusion 120, which localizes a large amount of the applied force onto a small surface area of the PV layer 110 near the protrusion 120. When the localized force applied is too strong, then one or more cracks 140 or some other defects (or shunts) can occur in the PV layer 110. The damage caused to the PV layer 110 by the crack 140 can render at least part of the PV layer 110 useless, which may reduce not only the efficiency of the overall optoelectronic component, but if the sample is sufficiently damaged and needs to be scrapped, the yield rate of the fabrication process is also reduced.

Figure 1C:
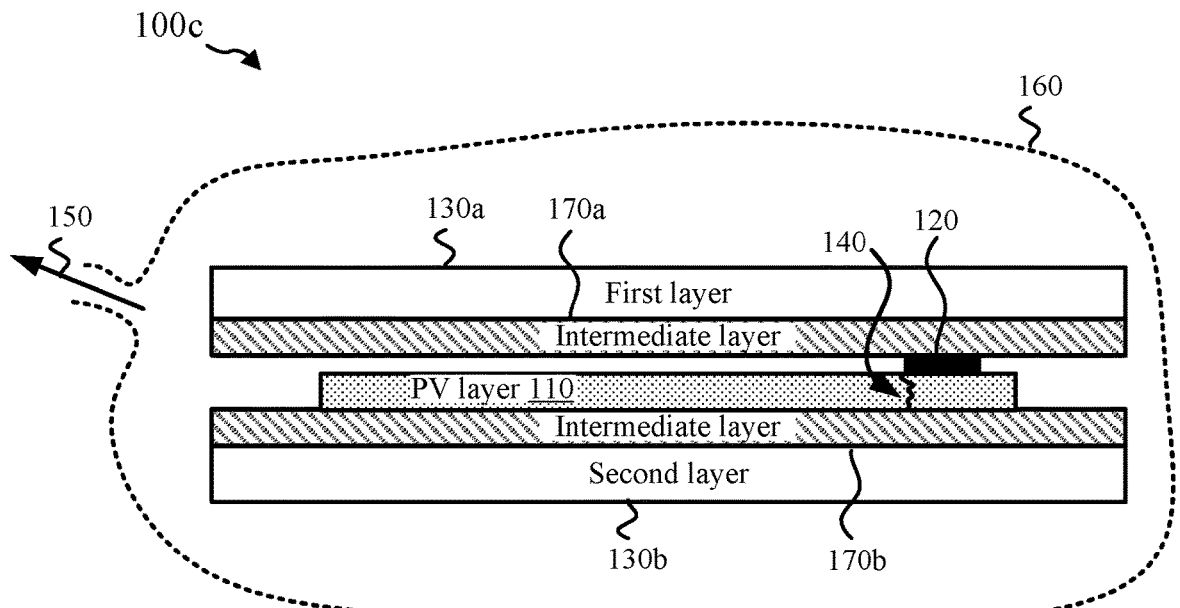

FIG. 1C shows a diagram 100*c* in which a stack of layers is placed inside a vacuum structure 160. In this example, however, an intermediate layer 170*a* is disposed or placed between the PV layer 110 and the first layer 130a, and an intermediate layer 170b is disposed or placed between the PV layer 110 and the second layer 130b. The intermediate layer 170a and the intermediate layer 170b can be referred to as interlayers and can be at least partially made of a thermoplastic such as TPO or polyvinyl butyral (PVB). These intermediate layers can provide structural rigidity to the stack of layers, as well as provide additional properties such as adhesion (e.g., to keep the different layers joined together), infrared (IR) blocking (e.g., to reduce heat that propagated through the stack), or ultraviolet (UV) blocking (e.g., to reduce UV rays from propagating through the stack).

Similarly to the structure in FIG. 1B, when vacuum is pulled and air/gas 150 is removed from the stack of layers inside the vacuum structure 160 in FIG. 1C as part of a "de-gassing" step, forces are applied to the first layer 130a and the intermediate layer 170a of the stack as well as the second layer 130b and the intermediate layer 170b of the stack. This in turn applies a force on the protrusion 120, which can produce one or more cracks 140 or some other defects (or shunts) on the PV layer 110.

Figure 1D:
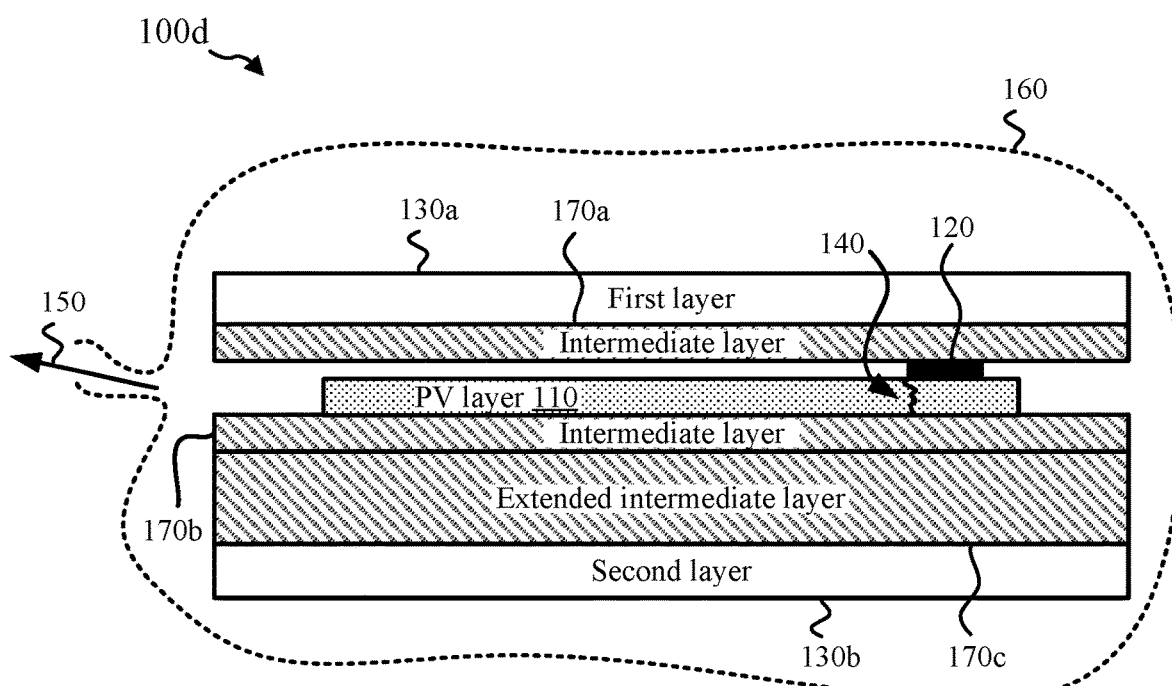
Figure 1E:
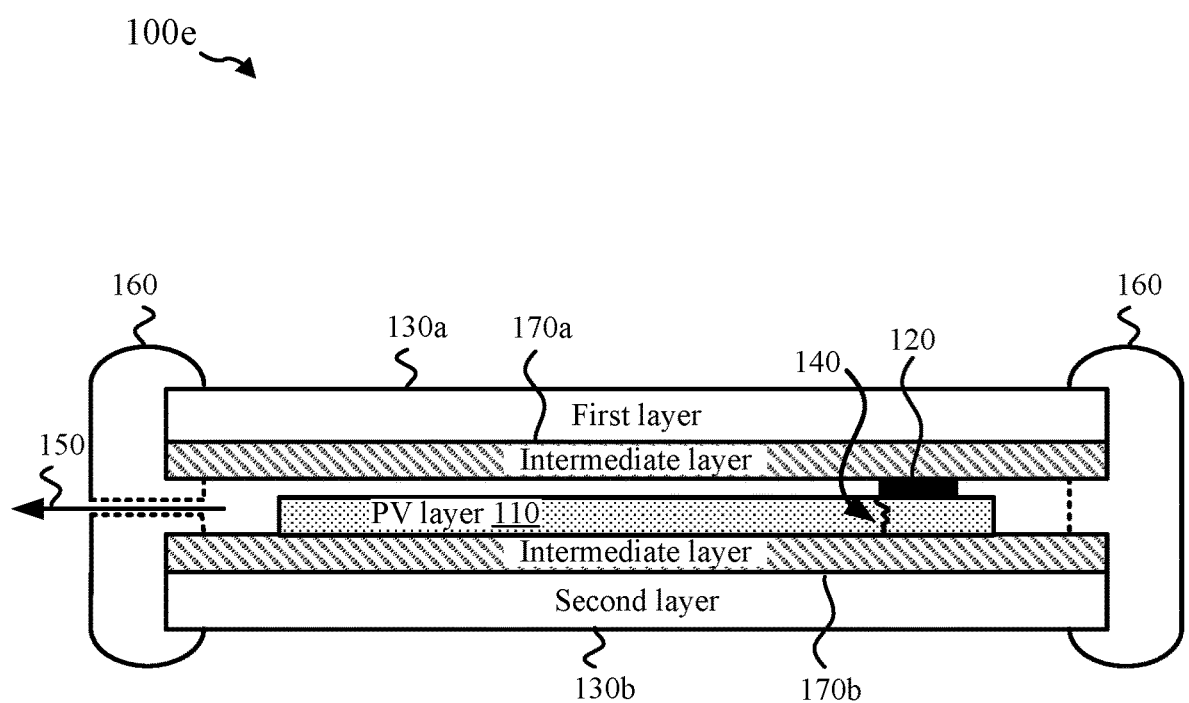

FIG. 1D shows a diagram 100d in which a stack of layers is placed inside a vacuum structure 160. This stack of layers is similar to the one in FIG. 1C with an extended intermediate layer 170c being disposed or placed between the intermediate layer 170b and the second layer 130b. The extended intermediate layer 170c can also be at least partially made of a thermoplastic such as PVB. Again, when vacuum is pulled and air/gas 150 is removed from the stack of layers inside the vacuum structure 160 in FIG. 1D, one or more cracks 140 or some other defects (or shunts) can occur in the PV layer 110 as a result of the forces produced.

FIG. 1E shows a diagram 100e having a similar stack of layers as the one shown in FIG. 1C. In this example, however, instead of having the vacuum structure 160 be a vacuum bag, a gasket is used to seal around the stack of layers to pull vacuum and remove air/gas 150 from the stack of layers. Like FIGS. 1B-1D above, one or more cracks 140 or some other defects (or shunts) can occur in the PV layer 110 as a result of the forces produced by the vacuum operation.

Figure 2:
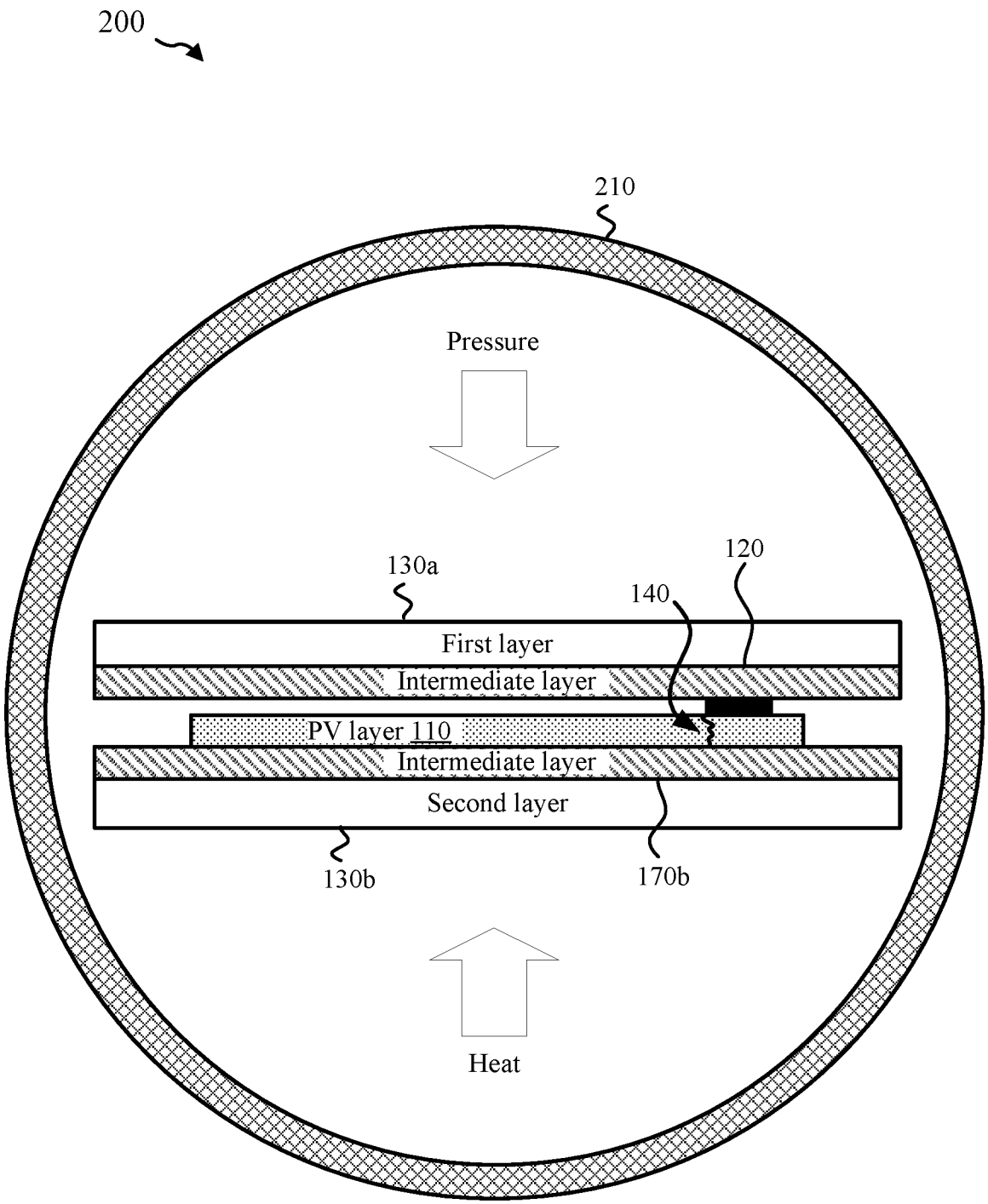
FIG. 2 illustrates an example of a structure with a PV layer cracking due to the topography of the PV layer while inside an autoclave chamber.

As described above, the "de-gassing" step can be an initial or first step associated with an autoclave lamination process or can be a standalone step. In FIG. 2, a diagram 200 shows a structure having a stack of layers is placed inside an autoclave chamber 210, where both pressure and heat can be applied simultaneously. For example, pressures greater than 10 bar at maximum temperature may be typical. The stack of layers in this example consists of the PV layer 110 sandwiched between the first layer 130a and the second layer 130b, with intermediate layers between the PV layer 110 and each of the first layer 130a and the second layer 130b (similar structure as shown in FIG. 1C). It is to be understood that this particular stack of layers is provided by way of example and that other stacks of layers (e.g., the ones shown in FIGS. 1B, 1C, and 1D) can also be used to illustrate the same scenario or situation.

Just like with the "de-gassing" step, the application of pressure and heat in the autoclave lamination process can cause localized forces near the protrusion 120, which can then result in one or more cracks 140 or some other defects (or shunts) on the PV layer 110, or can exacerbate any cracks, defects, or shunts caused by an earlier "de-gassing" step.

Figure 3A:
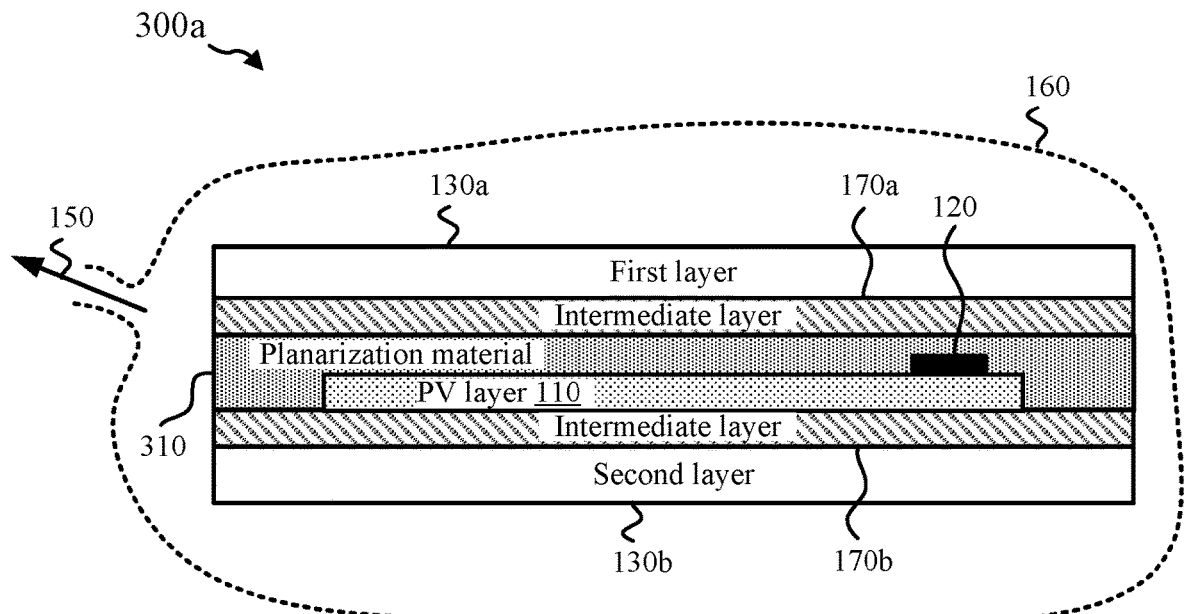
FIGS. 3A-3G illustrate examples of different structures with a planarized PV layer.

FIG. 3A shows a diagram 300a in which a stack of layers is placed inside a vacuum structure 160 as part of a "de-gassing" step (standalone or otherwise). In this example, the PV layer 110 is planarized by applying a planarization material 310 that covers at least a top potion or a top surface of the PV layer 110. The stack of layers also includes the intermediate layer 170a disposed or positioned between a top, planar side or surface of the planarization material 310 and the first layer 130a. Similarly, the stack of layers further includes the intermediate layer 170b disposed or positioned between a bottom side or surface of the planarization material 310 and/or of the PV layer 110 and the second layer 130b. It is to be understood that the terms "top side," "top surface," "bottom side," and "bottom surface" as used in this context are intended to indicate a position in connection with the structure shown in the diagram 300a of FIG. 3A and are not intended to provide an indication of whether a side or surface is a light-facing or not.

As shown in FIG. 3A, the protrusion 120 is covered by the planarization material 310, which similar to the intermediate layers 170a and 170b, can be made of PVB. In some examples, materials other than PVB can also be used for the planarization material 310. The coverage provided by the planarization materials 310 results in the PV layer 110 and the protrusion 120 being at least partially suspended or embedded within planarization material 310. In an aspect, it is possible to refer to the combination of the PV layer 110, the protrusion 120, and the planarization material 310 as a planarized PV layer, which has a planarized surface (e.g., flat or substantially flat surface) closest to the intermediate layer 170a.

When vacuum is pulled and air/gas 150 is removed from the stack of layers inside the vacuum structure 160 in FIG. 3A, forces are applied to the first layer 130a and the intermediate layer 170a of the stack, as well as to the second layer 130b and the intermediate layer 170b of the stack. Because these forces are now distributed across the planar surfaces produced by the planarization material 310, a crack, defect, and/or shunt is less likely to occur. That is, the forces are no longer localized near the protrusion 120 and are instead distributed over the entire planar surface provided by the planarization material 310. As a result, the electronic component yield rate of the manufacturing process can increase, which allows for reduced costs and higher-volume production.

FIGS. 3B-3G provide additional examples of structures having a stack of layers in which a planarization material is used to reduce or eliminate cracks, defects, and/or shunts caused by forces introduced during a "de-gassing" step or similar step. Details regarding these structures are provided below.

Figure 3B:
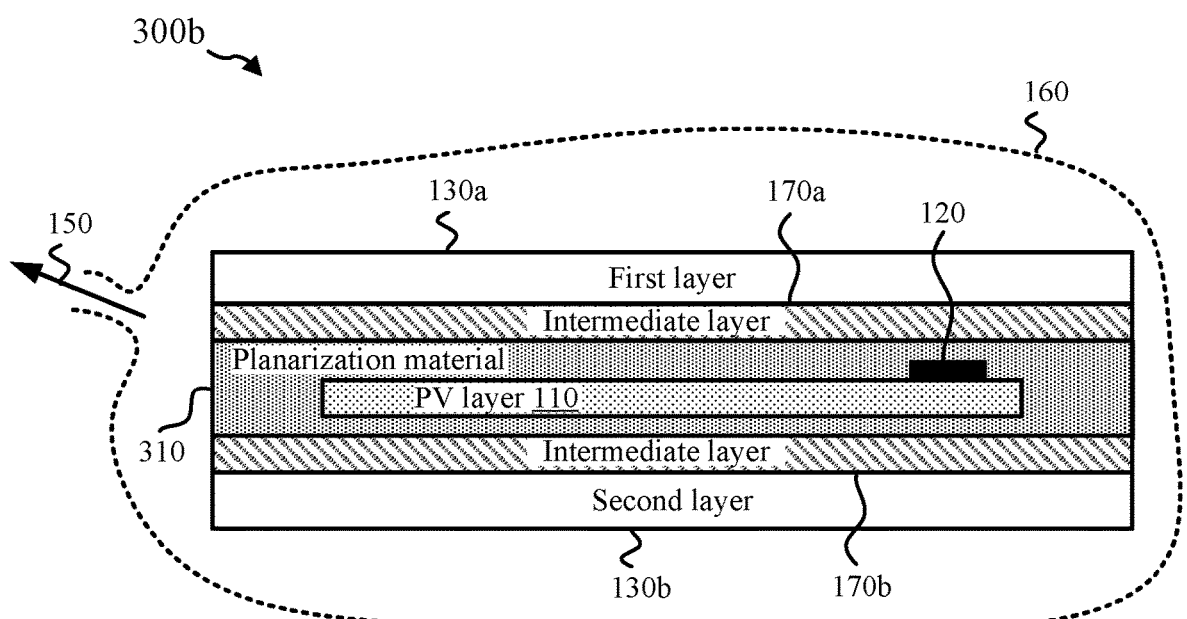

In the diagram 300b of FIG. 3B, the stack of layers inside the vacuum structure 160 (e.g., vacuum bag) includes the first layer 130a, the intermediate layer 170a, the planarization material 310, the PV layer 110 with the protrusion 120, the intermediate layer 170b, and the second layer 130b. In this example, the coverage provided by the planarization material 310 results in the PV layer 110 and the protrusion 120 being completely suspended or embedded within planarization material 310. In an aspect, it is possible to refer to the combination of the PV layer 110, the protrusion 120, and the planarization material 310 as a planarized PV layer, which has one planarized surface (e.g., flat or substantially flat surface) closest to the intermediate layer 170a and another planarized surface closest to the intermediate layer 170b such that the planarized PV layer is between the intermediate layers 170a and 170b.

Figure 3C:
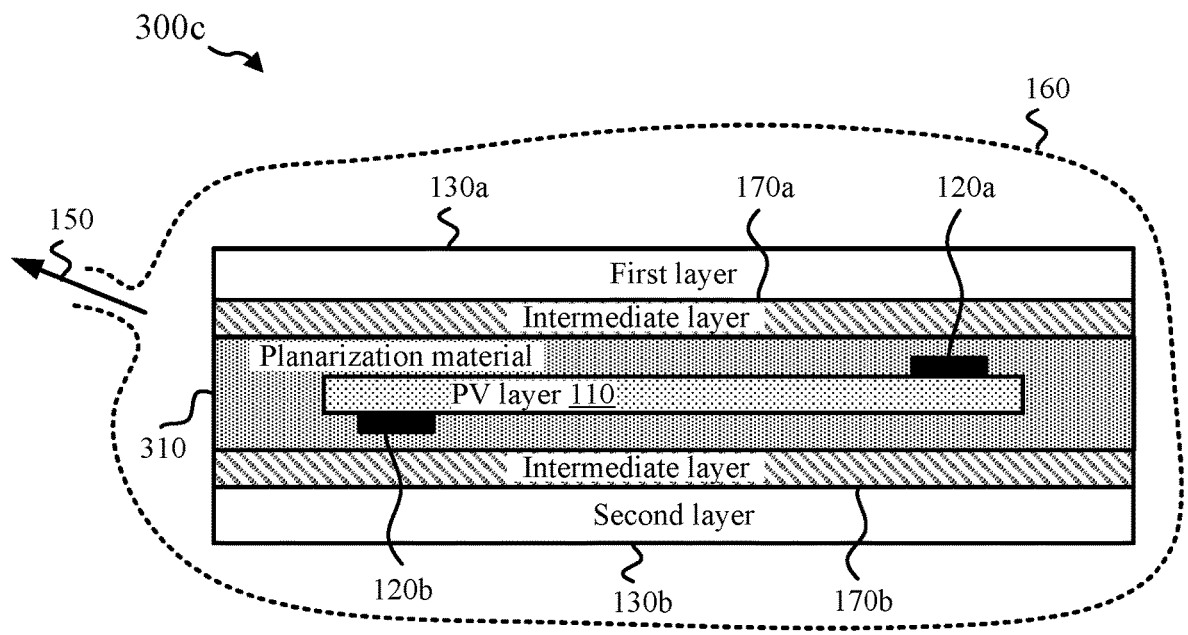

In the diagram 300c of FIG. 3C, the stack of layers inside the vacuum structure 160 (e.g., vacuum bag) includes the first layer 130a, the intermediate layer 170a, the planarization material 310, the PV layer 110 with a first protrusion 120a on one surface and a second protrusion 120b on the opposite surface, the intermediate layer 170b, and the second layer 130b. In this example, the coverage provided by the planarization material 310 results in the PV layer 110 and the protrusions 120a and 120b being completely suspended or embedded within planarization material 310. In an aspect, it is possible to refer to the combination of the PV layer 110, the protrusions 120a and 120b, and the planarization material 310 as a planarized PV layer, which has one planarized surface (e.g., flat or substantially flat surface) closest to the intermediate layer 170a and another planarized surface closest to the intermediate layer 170b such that the planarized PV layer is between the intermediate layers 170a and 170b.

Figure 3D:
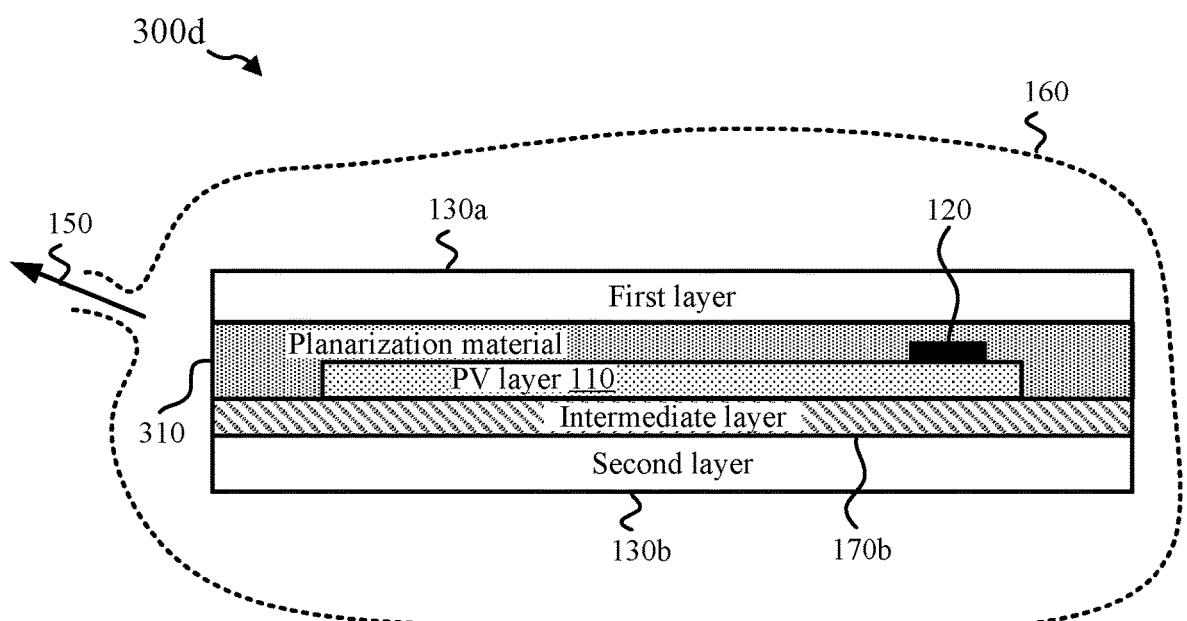

In the diagram 300d of FIG. 3D, the stack of layers inside the vacuum structure 160 (e.g., vacuum bag) includes the first layer 130a, the planarization material 310, the PV layer 110 with the protrusion 120, the intermediate layer 170b, and the second layer 130b. Note that in this example the intermediate layer 170a is absent such that the planarization material 310 is in direct contact (e.g., directly bonded) with the first layer 130a. The coverage provided by the planarization material 310 results in the PV layer 110 and the protrusion 120 being at least partially suspended or embedded within planarization material 310. In an aspect, it is possible to refer to the combination of the PV layer 110, the protrusion 120, and the planarization material 310 as a planarized PV layer, which has a planarized surface (e.g., flat or substantially flat surface) closest to the first layer 130a.

Figure 3E:
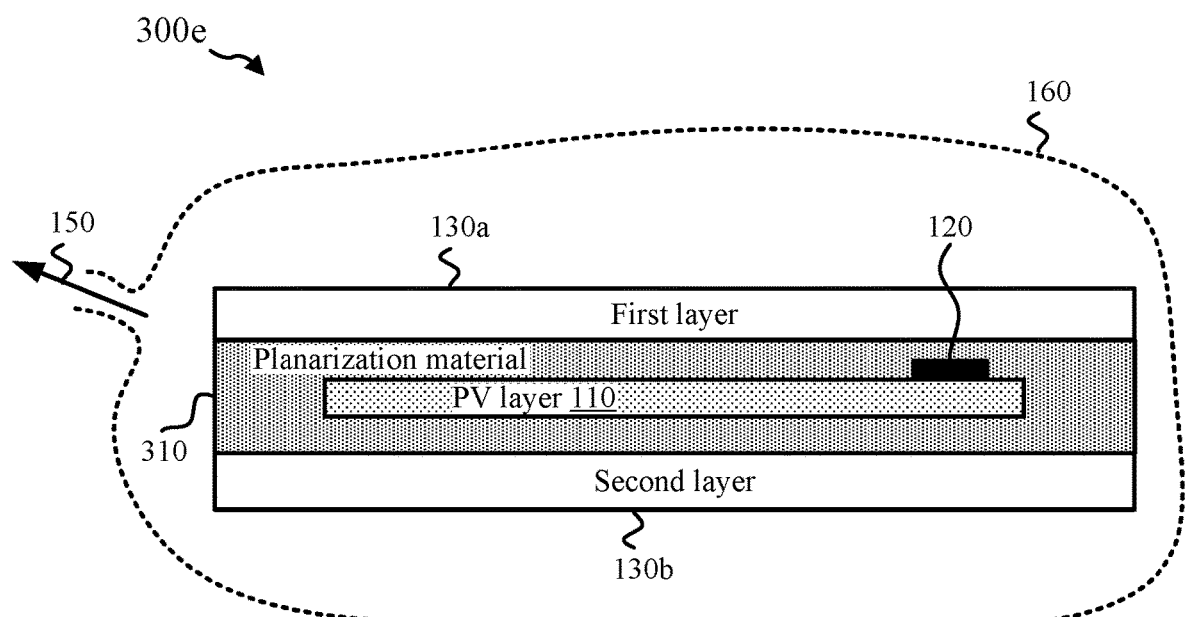

In the diagram 300e of FIG. 3E, the stack of layers inside the vacuum structure 160 (e.g., vacuum bag) includes the first layer 130a, the planarization material 310, the PV layer 110 with the protrusion 120, and the second layer 130b. Note that in this example the intermediate layers 170a and 170b are absent such that the planarization material 310 is in direct contact (e.g., directly bonded) with the first layer 130a and the second layer 130b. The coverage provided by the planarization material 310 results in the PV layer 110 and the protrusion 120 being completely suspended or embedded within planarization material 310. In an aspect, it is possible to refer to the combination of the PV layer 110, the protrusion 120, and the planarization material 310 as a planarized PV layer, which has one planarized surface (e.g., flat or substantially flat surface) closest to the first layer 130a and another planarized surface closest to the second layer 130b such that the planarized PV layer is between the first layer 130a and the second layer 130b.

Figure 3F:
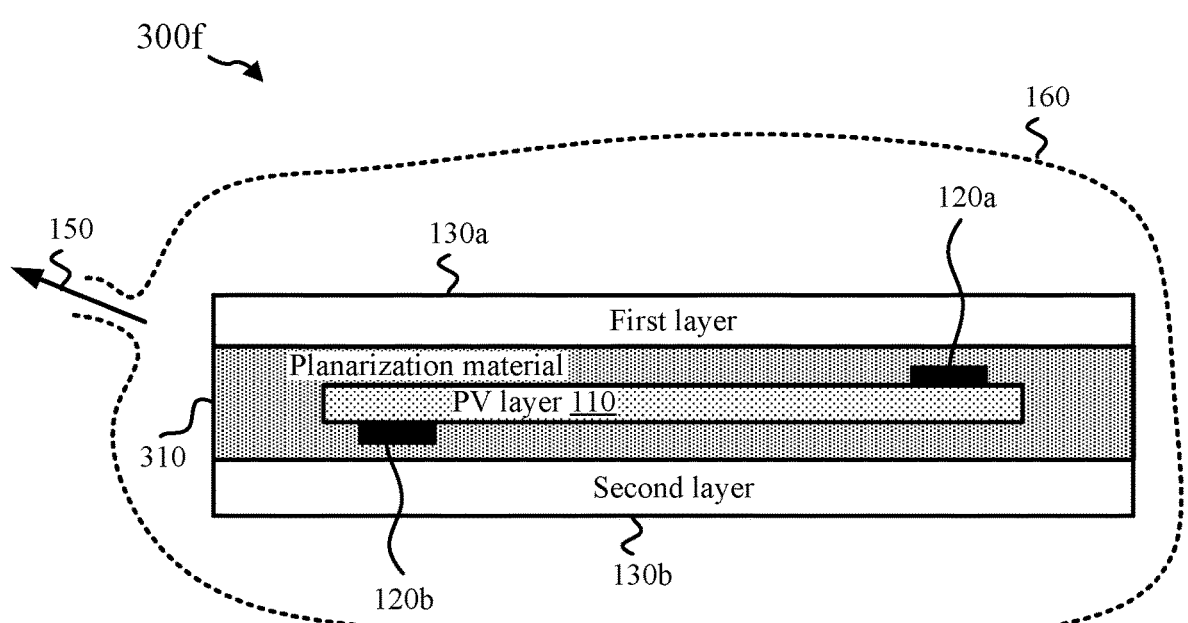

In the diagram 300f of FIG. 3F, the stack of layers inside the vacuum structure 160 (e.g., vacuum bag) includes the first layer 130a, the planarization material 310, the PV layer 110 with a first protrusion 120a on one surface and a second protrusion 120b on the opposite surface, and the second layer 130b. Note that in this example the intermediate layers 170a and 170b are absent such that the planarization material 310 is in direct contact (e.g., directly bonded) with the first layer 130a and the second layer 130b. The coverage provided by the planarization material 310 results in the PV layer 110 and the protrusions 120a and 120b being completely suspended or embedded within planarization material 310. In an aspect, it is possible to refer to the combination of the PV layer 110, the protrusions 120a and 120b, and the planarization material 310 as a planarized PV layer, which has one planarized surface (e.g., flat or substantially flat surface) closest to the first layer 130a and another planarized surface closest to the second layer 130b such that the planarized PV layer is between the first layer 130a and the second layer 130b.

Figure 3G:
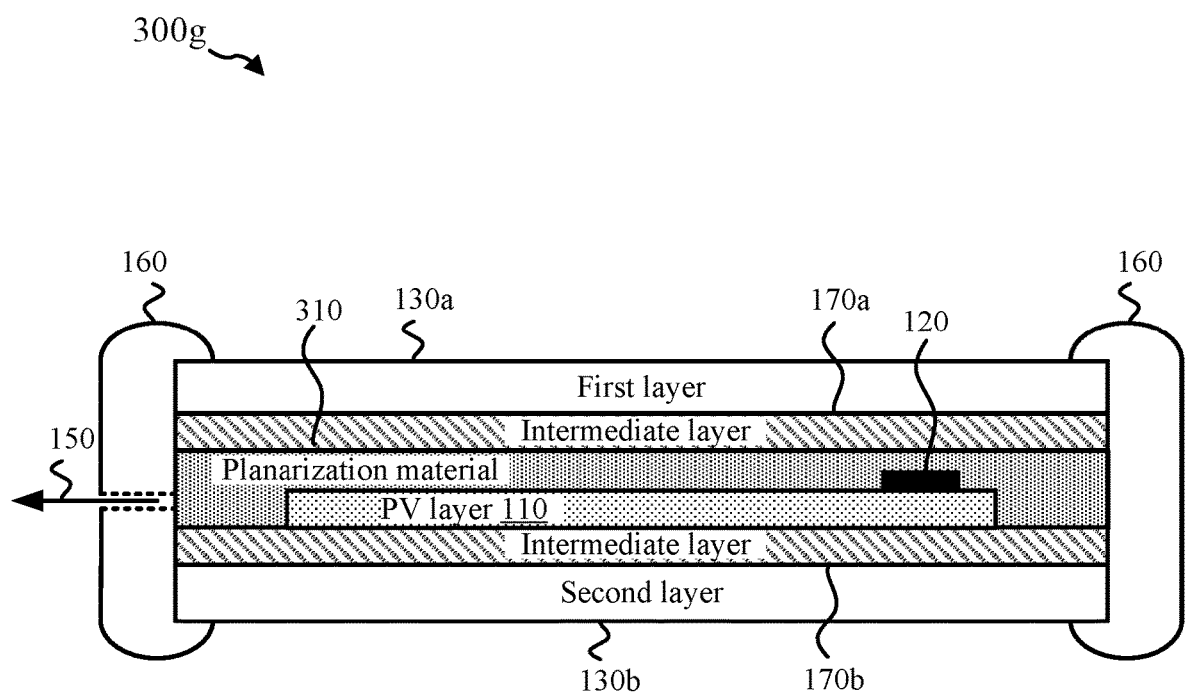

In the diagram 300g of FIG. 3G, the stack of layers shown is similar to the stack of layers shown in FIG. 3A. In this example, however, instead of having the vacuum structure 160 be a vacuum bag, a gasket is used to seal around the stack of layers to pull vacuum and remove air/gas 150 from the stack of layers.

Figure 4:
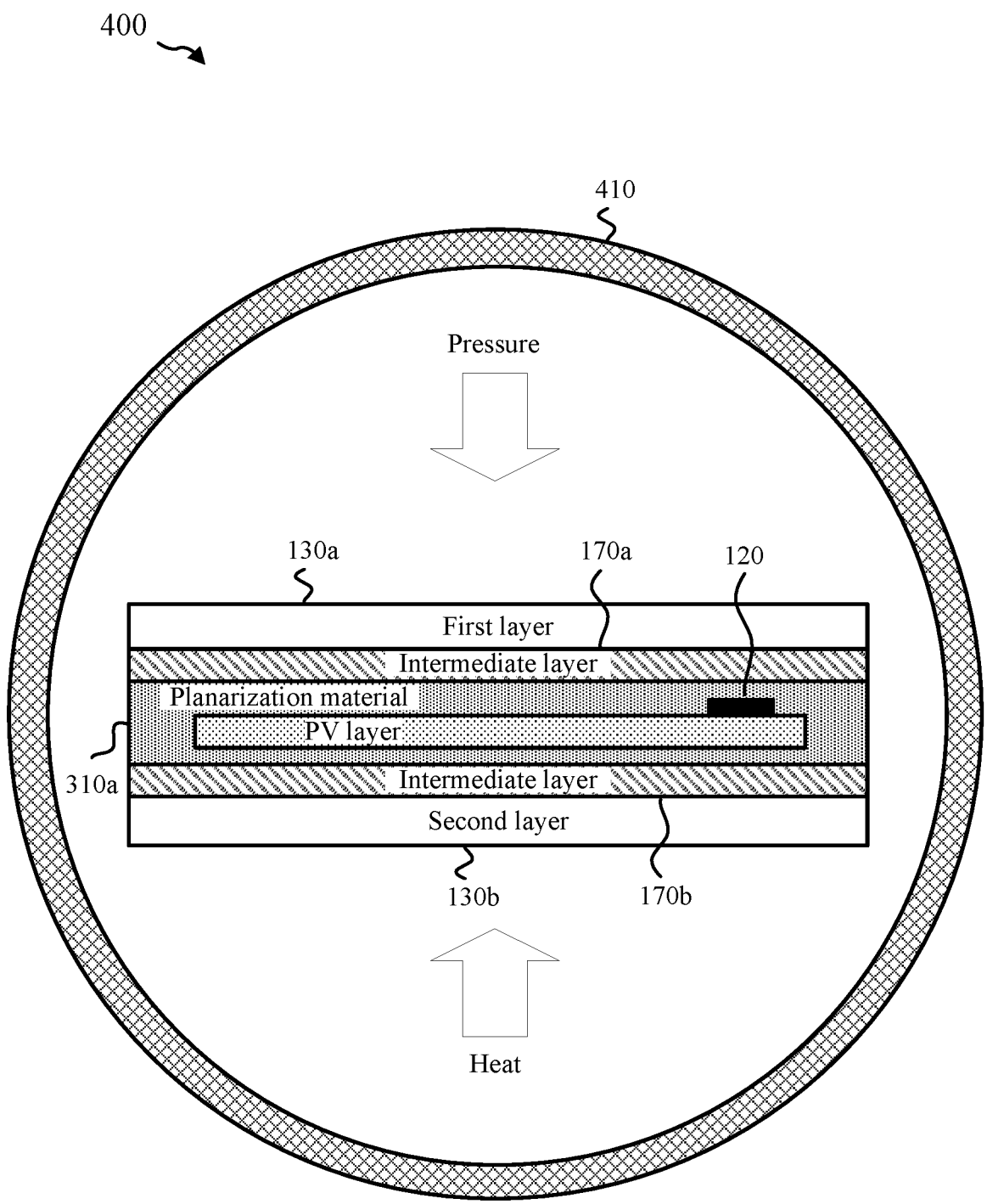
FIG. 4 illustrates an example of a structure with a planarized PV layer inside an autoclave chamber.

In FIG. 4, a diagram 400 shows a structure having a stack of layers is placed inside an autoclave chamber 410, where both pressure and heat can be applied simultaneously. For example, pressures greater than 10 bar at maximum temperature may be typical. The stack of layers in this example consists of the PV layer 110 with the protrusion 120 completely covered by the planarization material 310 to produce a planarized PV layer that is sandwiched between the intermediate layers 170a and 170b, which in turn are protected by the first layer 130a and the second layer 130b, respectively (similar structure as shown in FIG. 3B). It is to be understood that this particular stack of layers is provided by way of example and that other stacks of layers (e.g., the ones shown in FIGS. 3A and 3C-3G) can also be used to illustrate the same scenario or situation.

Just like with the "de-gassing" step, the autoclave lamination process involves the application of pressure and heat. In this scenario, however, the forces that result are now distributed across the planar surfaces produced by the planarization material 310 (e.g., flat or substantially flat surface between planarization material 310 and the intermediate layer 170a), and consequently, a crack, defect, and/or shunt is less likely to occur. That is, the forces are no longer localized near the protrusion 120 and are instead distributed over the entire planar surface provided by the planarization material 310. As a result, the electronic component yield rate of the manufacturing process can increase, which allows for reduced costs and higher-volume production.

Figure 5A:
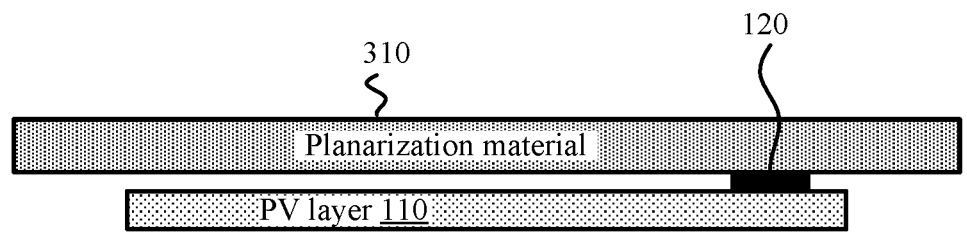
FIGS. 5A-5I illustrate examples of various steps for constructing a structure with a planarized PV layer.

FIGS. 5A-5I illustrate examples of various steps for constructing a structure with a planarized PV layer. In FIG. 5A, a diagram 500a shows a stack of layers that is formed by disposing or placing a layer of the planarization material 310 adjacent or next to a top surface of the PV layer 110 with the protrusion 120. The example shown in the diagram 500a of FIG. 5A corresponds to the scenario in which the planarization material 310 is applied to one surface of the PV layer 110.

Figure 5B:
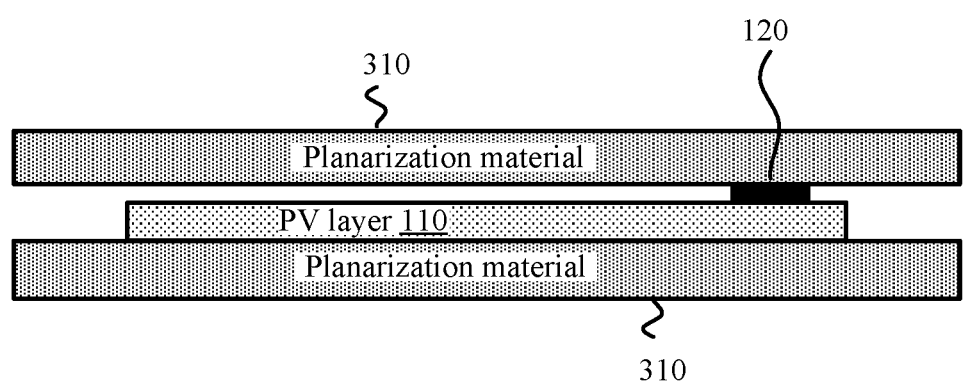

In FIG. 5B, a diagram 500b shows a stack of layers that is formed by disposing or placing a layer of the planarization material 310 adjacent or next to a top surface of the PV layer 110 with the protrusion 120 and an additional layer of the planarization material 310 adjacent or next to a bottom surface of the PV layer 110 without the protrusion 120. The example shown in the diagram 500b of FIG. 5B corresponds to the scenario in which the planarization material 310 is applied to both surfaces of the PV layer 110. It is to be understood that the terms "top surface" and "bottom surface" as used in this context are intended to indicate a position in connection with the structure shown in the diagrams 500a and 500b of FIGS. 5A and 5B, respectively, and are not intended to provide an indication of whether a surface is a light-facing surface or not.

The planarization material 310 that is disposed or placed adjacent to the PV layer 110 can include thermoplastics such as polyolefins (TPO), polyvinyl butyral (PVB), Ionomers, thermoplastic polyurethanes (TPU), thermoplastic silicone elastomers (TPSE), or thermosets such as ethylene-vinyl acetate (EVA), silicones, or polyolefin elastomers (POE). In one example, each layer of the planarization material 310 can both be approximately 0.1 millimeters (mm) in thickness. In another example, each of the layers of the planarization material 310 in FIG. 5B can have a different thickness.

The same planarization material 310 can be used for each of the layers in FIG. 5B (e.g., both can be PVB). In some implementations, however, the planarization material 310 in each of these layers can be different. For example, the planarization material 310 disposed adjacent the top surface of the PV layer 110 can be a thermoplastic and the planarization material 310 disposed adjacent the bottom surface can be a thermoset. In another example, the planarization material 310 disposed adjacent the top surface of the PV layer 110 can be a thermoplastic such as PVB and the planarization material 310 disposed adjacent the bottom surface can be another thermoplastic such as thermoplastic polyurethane (TPU).

The planarization material 310 can be heated to laminate or cover at least a portion of the PV layer 110 and the protrusion 120. For example, when a single layer of the planarization material 310 is used as in FIG. 5A, the planarization material 310 when heated can change its form to cover or embed a top portion of the PV layer 110 with the protrusion 120 within the planarization material 310. In another example, when two layers of the planarization material 310 are used as in FIG. 5B, the planarization material 310 when heated can change its form to completely cover or embed the PV layer 110 with the protrusion 120 within the planarization material 310.

The PV layer 110 with the protrusion 120 when at least partially embedded within the planarization material 310 provides a planarized PV layer that can have a planar surface at the top made from the planarization material 310 (e.g., when a single layer of the planarization material 310 is used as in FIG. 5A) or can have planar surfaces at the top and bottom made from the planarization material 310 (e.g., when two layers of the planarization material 310 are used as in FIG. 5B).

Figure 5C:
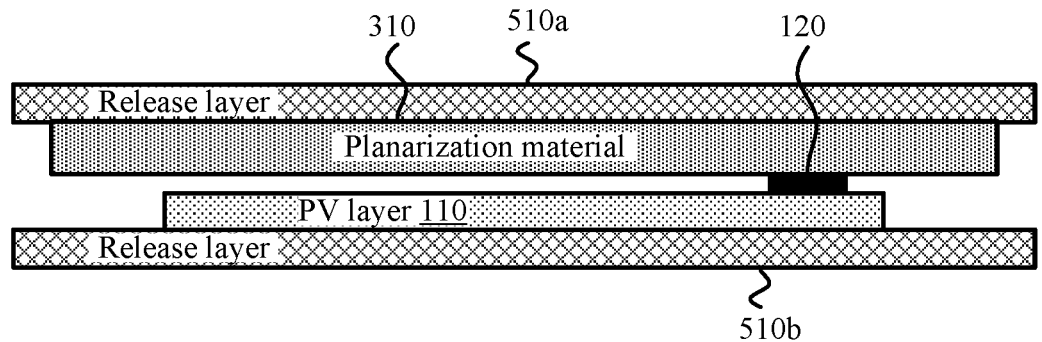

In FIG. 5C, a diagram 500c shows the same stack of layers described in the diagram 500a of FIG. 5A while additionally including a release layer 510a disposed or placed adjacent or next to the planarization material 310, and further including a release layer 510b disposed or placed adjacent or next to the bottom surface of the PV layer 110 with the protrusion 120.

Figure 5D:
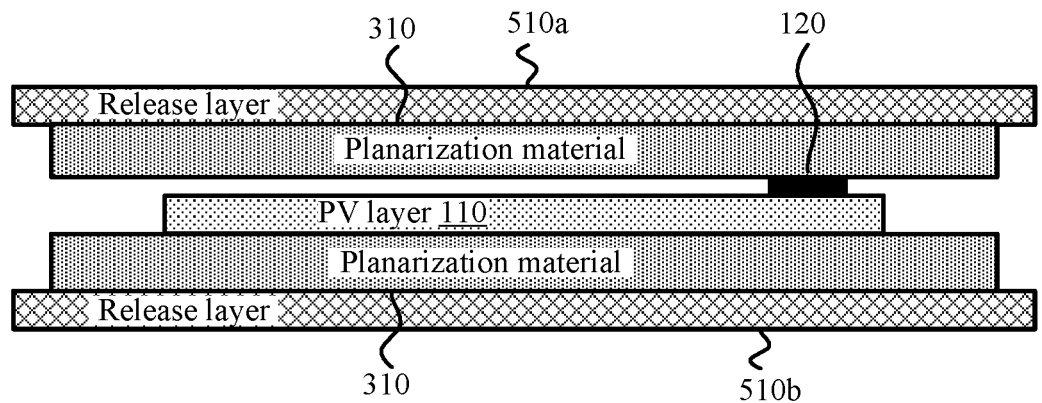

In FIG. 5D, a diagram 500d shows the same stack of layers described in the diagram 500b of FIG. 5B while additionally including the release layer 510a disposed or placed adjacent or next to the planarization material 310 positioned over the PV layer 110 with the protrusion 120, and further including the release layer 510b disposed or placed adjacent or next to the planarization material 130 positioned below the PV layer 110 with the protrusion 120.

The release layers 510a and 510b can be made from thin sheets of Teflon® or other type of polytetrafluoroethylene (PTFE) or other materials (e.g., silicones) with non-stick properties such that when the planarization material 310 melts or softens by the application of heat, it can be easily ready for assembly with other layers. That is, the release layers 510a and 510b can be easily removed to make a planarized PV layer (e.g., the PV layer 110 with the protrusion 120 having one or two planar surfaces made from the planarization material 310) available for assembly as part of an optoelectronic component, as discussed herein.

Figure 5E:
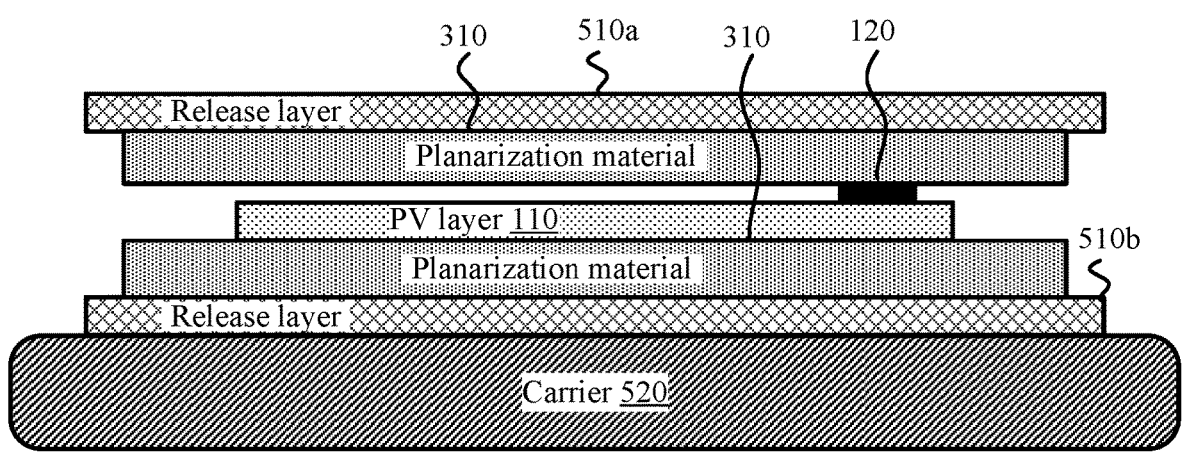

FIG. 5E shows a diagram 500e in which the same stack of layers described above in connection with FIG. 5D is placed on a carrier 520. It is to be understood that the stack of layers shown in the diagram 500e of FIG. 5E is provided by way of illustration and other stacks of layers can be similarly used.

The carrier 520 can be, for example, a high-temperature fiberglass carrier. That is, the carrier 520 can be made of fiberglass (e.g., fiber-reinforced plastic using glass fiber) such that it maintains its structural rigidity under high-temperature conditions. Other materials such as carbon fiber composites, steel, and aluminum can also be used to construct a high temperature carrier. In the example of fiberglass, the softening and melting points of the fiberglass can be significantly higher than the softening and melting points of the planarization material 310. This allows for the various layers of the planarization material 310 to soften or melt when heat is applied while allowing for carrier 520 to remain structurally sound. In some implementations, the stack of layers can instead be placed within a vacuum structure 160 or within a chamber (e.g., the autoclave chambers 210 and 410) without the use of a carrier.

Figure 5F:
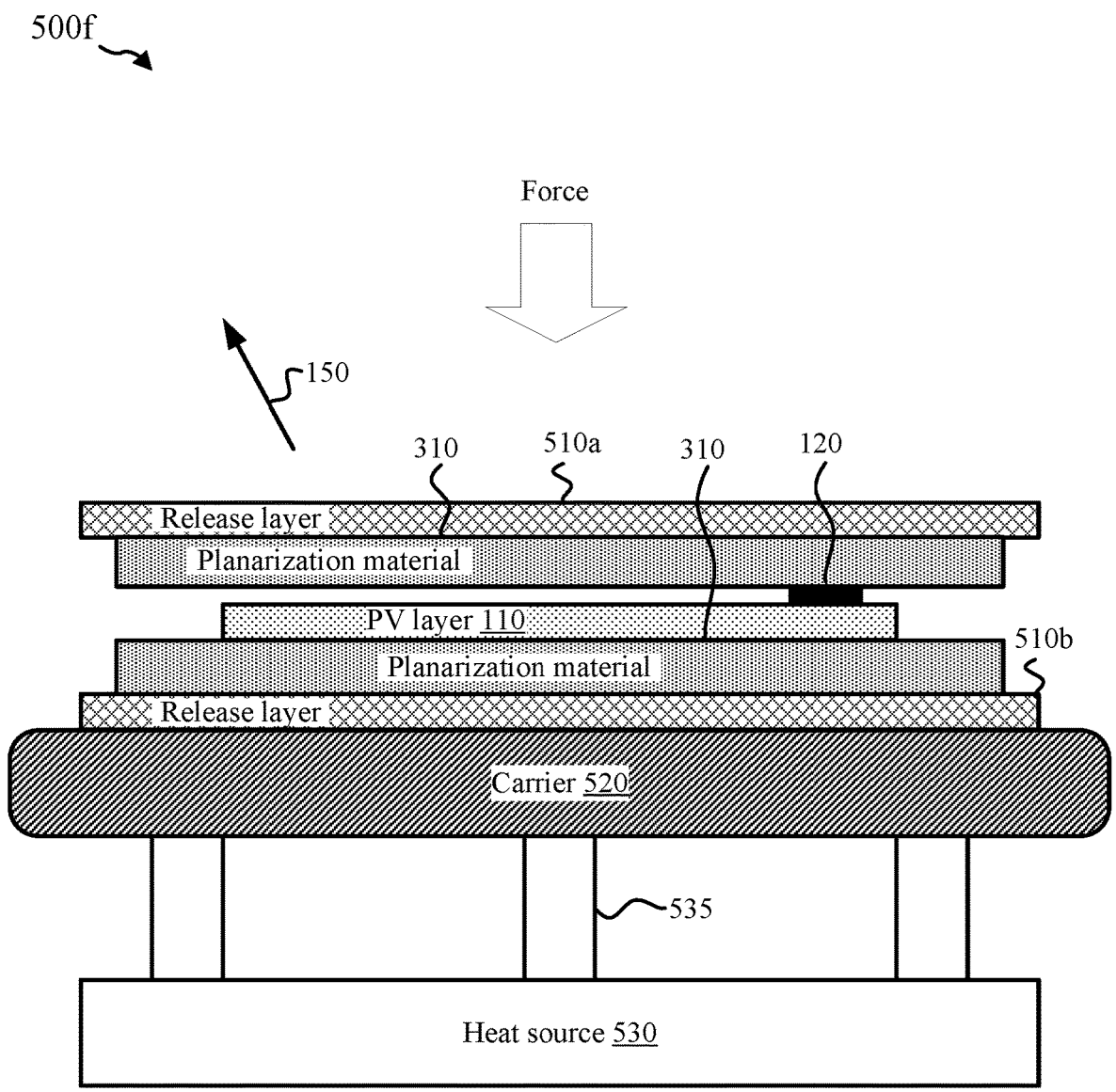
Figure 5G:
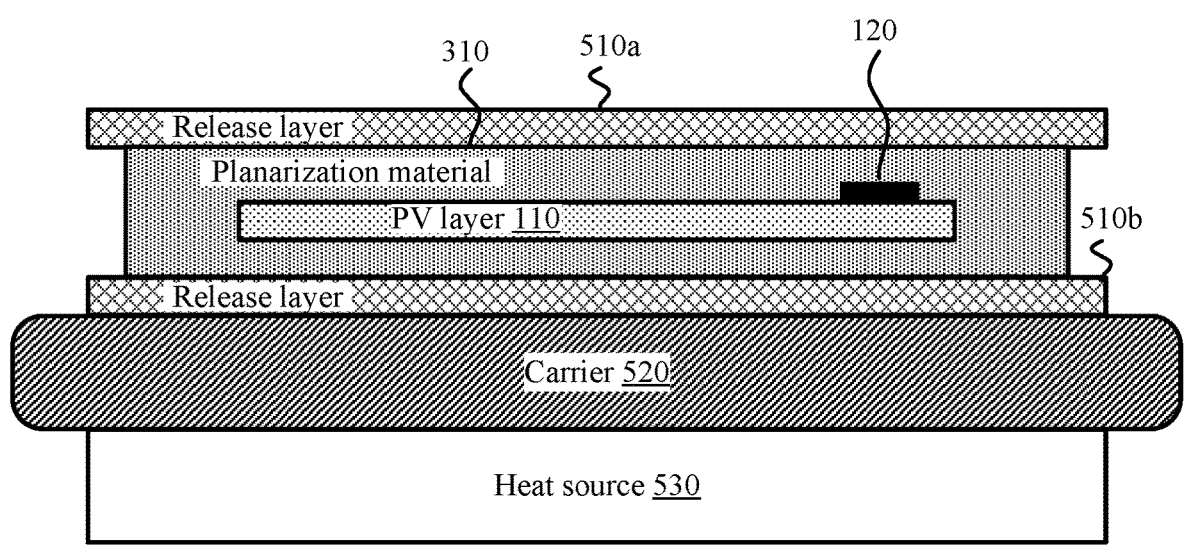

FIG. 5F shows a diagram 500f in which the stack of layers on the carrier 520 as shown in FIG. 5E is placed inside a vacuum bag (e.g., a Teflon® bag) or chamber and a vacuum is provided. In this scenario, a heat source 530, such as a hot plate with pins (e.g., pins 535 are depicted in the heat source 530) can be used to provide heat. Air/gas 150 can be pumped out such that the chamber has less air within (e.g., a full or partial vacuum). This results in the pressure inside the bag or chamber being less than the atmospheric pressure outside of the bag or chamber.

The heat provided by the heart source 530 is used to soften or melt the layers of the planarization material 310 such that the planarization material 310 changes its form to surround at least partially the PV layer 110 with the protrusion 120. For example, the heat source 530 can be configured to adjusts its temperature such that an increase in temperature results in heat being thermally conducted to the carrier 520, and thereby to the planarization material 310.

When initially placed on the pins of the heat source 530, the carrier 520 with the stack of layers can be positioned away from the heat source 530 as shown in FIG. 5F. In this way, the transfer of heat from the heat source 530 to carrier 520 can be controlled (e.g., slowed down to a desired amount) to allow for improved de-gassing before the planarization material 310 becomes softened in response to the heat. That is, the distance between the heat source 530 and the carrier 520 can be controlled to also control the transfer of heat (e.g., rate of heat transfer) to the carrier 520 from the heat source 530. Then, as shown in the diagram 500g of FIG. 5G, in order to speed up the softening of the planarization material 310, the pins 535 can be retracted such that carrier 520 is brought closer to heat source 530. For example, the pins 535 can be completely retracted such that the carrier 520 is in direct contact with the heat source 530 such that the transfer of heat to the layers of the stack can be expedited.

In some implementations, the stack of layers, and therefore the planarization material 310, can be heated without the use of the pins 535. For example, if the softening or melting point of the planarization material 310 is high, then the pins 535 or extending the pins 535 may not be needed. In such a case, the carrier 520 can be placed directly in contact with the heat source 430. Alternatively, the carrier 520 may not be used at all, in which case the stack of layers can be placed directly on the heat source 530 (or directly on the pins 535 if used).

In general, the heat source 530 is used to heat the carrier 520, which in turn heats the stack of layers that includes one or more layers of the planarization material 310. When the temperature of the heat source 530 is sufficiently high, the layer or layers of the planarization material 310 can begin to soften (e.g., when their temperature reaches their softening point, which is the point at which materials begin to soften). The application of the vacuum (e.g., also refer to as pulling vacuum) causes air, gas, and/or moisture to be removed from the bag or chamber such that the planarization material 310 does not melt or sag unexpectedly, and/or to avoid air bubbles as the planarization material 310 softens or melts. At this point, force can be applied to the stack of layers. That is, force can be applied to the stack of layers when the temperature of the planarization material 310 approaches or reaches its softening point. When different types of planarization material 310 are used in the stack of layers, the application of force may depend on the different softening points of the different types of the planarization material 310.

Figure 5H:
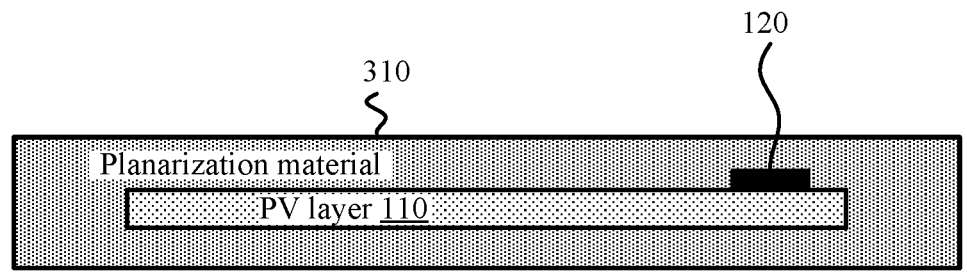

In connection with the application of force to the stack of layers, force can be applied to the release layer 510a. The source of the force can be based on the type of bag or chamber being used. In some implementations, a silicone diaphragm can be used to press down on the release layer 510a to provide the force. The silicone diaphragm can descend or approach the release layer 510a upon the application of the vacuum or heat, or both. By applying the force, the form of the now softened planarization material 310 can be changed to allows for the (partial or complete) encapsulation or embedding of the PV layer 110 with the protrusion 120 within of the planarization material 310. For example, a diagram 500h of FIG. 5H shows the PV layer 110 with the protrusion 120 suspended (e.g., surrounded, embedded) within the planarization material 310. The planarized PV layer in FIG. 5H can be the result of the softening and/or melting of two layers of the planarization material 310 (e.g., one layer on top of the PV layer 110 and another layer below the PV layer 110) and the force applied to the stack of layers to cause the softened and/or melted planarization material 310 to surround or embed the PV layer 110 with the protrusion 120.

Figure 5I:
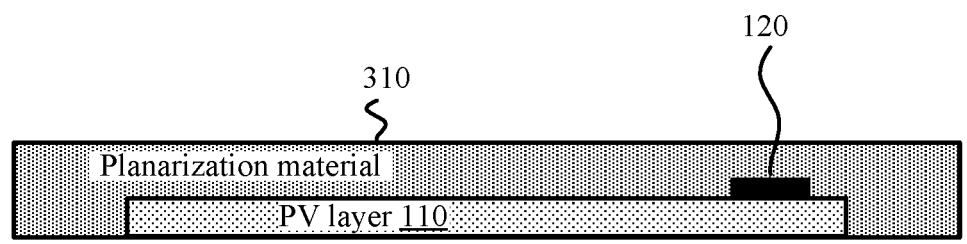

FIG. 5I shows a diagram 500i in which another example of a planarized PV layer is described. In this example, the planarized PV layer can be the result of the softening and/or melting of a single layer of the planarization material 310 (e.g., a layer on top of the PV layer 110) and the force applied to the stack of layers to cause the softened and/or melted planarization material 310 to surround or embed a top portion of the PV layer 110 with the protrusion 120.

As shown in FIGS. 5H and 5I, the application of force when the planarization material 310 is malleable after reaching its softening point allows for the physical form of the planarization material 310 to be modified through the use of heat and force such that the PV layer 110 with the protrusion 120 can be at least partially (if not completely) embedded within the planarization material 310.

The application of force as described above can be controlled during different phases of the process of forming a planarized PV layer. For example, the force can first be applied when the planarization material 310 reaches its softening point. At this point, the planarization material 310 has softened and is more malleable to applied force, and can therefore change its form (e.g., deform) from the application of the force. As more force is applied, the thermal conduction of heat to the planarization material 310 increases along, which in turn causes the temperature of the planarization material 310 to increase. The force can be maintained until the melting point of the planarization material 310 is about to be reached (e.g., just before it is reached) or until it has been reached. At that point, the application of force can be stopped, or alternatively, the application of force can be maintained to allow the planarization material 310 to better conform to surfaces, to improve adhesion between the layers of the stack, and/or to allow for proper curing of the planarization material 310 if thermosets are used.

The amount of force and/or the rate of application of force can also be adjusted during the process of forming a planarized PV layer. For example, a first, low amount of force can be applied to the release layer 510a to reduce or prevent the deformation or wrinkling of a layer of the planarization material 310 placed over the PV layer 110 with the protrusion 120 as the materials' temperature increases and approaches its softening point. Then, a second, higher amount of force can be applied. The second amount of force can be slowly ramped, or increased, at a rate such that the various layers of the planarization material 310 can deform and flow to surround or embed the PV layer 110 with the protrusion 120 within planarization material 310.

If the various layers of the planarization material 310 are made of the same material, then the planarization material 310 that ends up surrounding the PV layer 110 with the protrusion 120 can be a monolithic structure (see e.g., FIG. 5H). Alternatively, as described above, different layers of the planarization material 130 can be made of different materials.

Following the processes described above in connection with FIGS. 5E-5G, the stack of layers can be removed from the carrier 520 (if used) and the release layers 510a and 510b can also be removed. The structure shown in FIG. 5H represents an example of a planarized PV layer that remains from the stack of layers after the removal of the carrier 520 and/or the release layers 510a and 510b. This example is based on the scenario in which two layers of the planarization material 310 were used to surround the PV layer 110 with the protrusion 120. The structure shown in FIG. 5I represents another example of a planarized PV layer that remains from the stack of layers after the removal of the carrier 520 and/or the release layers 510a and 510b. This example is based on the scenario in which a single layer of the planarization material 310 was used to surround a top portion of the PV layer 110 with the protrusion 120. The planarized PV layers shown in FIGS. 5H and 5I are available for assembly or integration into an optoelectronic component. For example, the planarized PV layers shown in FIGS. 5H and 5I can then be assembled with other layers and subjected to additional processes, including additional vacuum processes.

The amount of force, temperature, pressure, and rates of change of these variables can be dependent upon the type of material used for the layer or layers of the planarization material 310. For example, a layer of PVB might have different variables and rates of change than a layer of EVA.

Regarding PVB, a 0.1 millimeter (mm) thick PVB thermoplastic can be used for a layer of the planarization material 310. The PVB layer is initially placed in a vacuum at 1,000 millibar (mbar) with the heat source 530 providing heat at 150° C. Next, the pressure is reduced to close to 0 mbar over a 600 seconds period. This allows for the degassing and relatively slow heating of the PVB—the pins 535 of the heat source 530 can be extended such that the carrier 520 is positioned away from the heat source 530 for the slow heating. Then, over the following ten seconds, the pins 535 can be retracted such that the carrier 520 is positioned in direct or close contact with the heat source 530. For the next 120 seconds, a force is applied at 1,000 mbar of press pressure. For the following 300 seconds, the force is maintained to allow for the PVB layer to melt and flow around the PV layer 110 with the protrusion 120 such that they are embedded within the planarization material 310 (e.g., the PVB).

On the other hand, if a 0.1 mm thick EVA thermoset is used for a layer of the planarization material 310, the variables may be different from those mentioned above. In one such example, the EVA layer can be placed within a vacuum at 1,000 mbar and the heat source 530 provides heat at 150° C. Then, for the first 360 seconds, the pressure is reduced to close to 0 mbar to allow for the de-gassing and to slow down the heating of the EVA. For the following 10 seconds, the pins 535 can be retracted. Next, for 90 seconds, a 1,000 mbar of pressure is applied to the stack of layers that includes the EVA layer. This is followed by 720 seconds of additional application of the press pressure to allow for the EVA layer to melt and flow around the PV layer 110 with the protrusion 120 such that they are embedded within the planarization material 310 (e.g., the EVA).

Once the planarized PV layers described above are assembled as part of a stack of layers of an optoelectronic component they can be used for various industrial applications. The stack of layers of the optoelectronic component can include external layers that provide operational and/or environmental protection, such as the first layer 130a and the second layer 130b described above at least in connection with FIGS. 1B-4.

Figure 6:
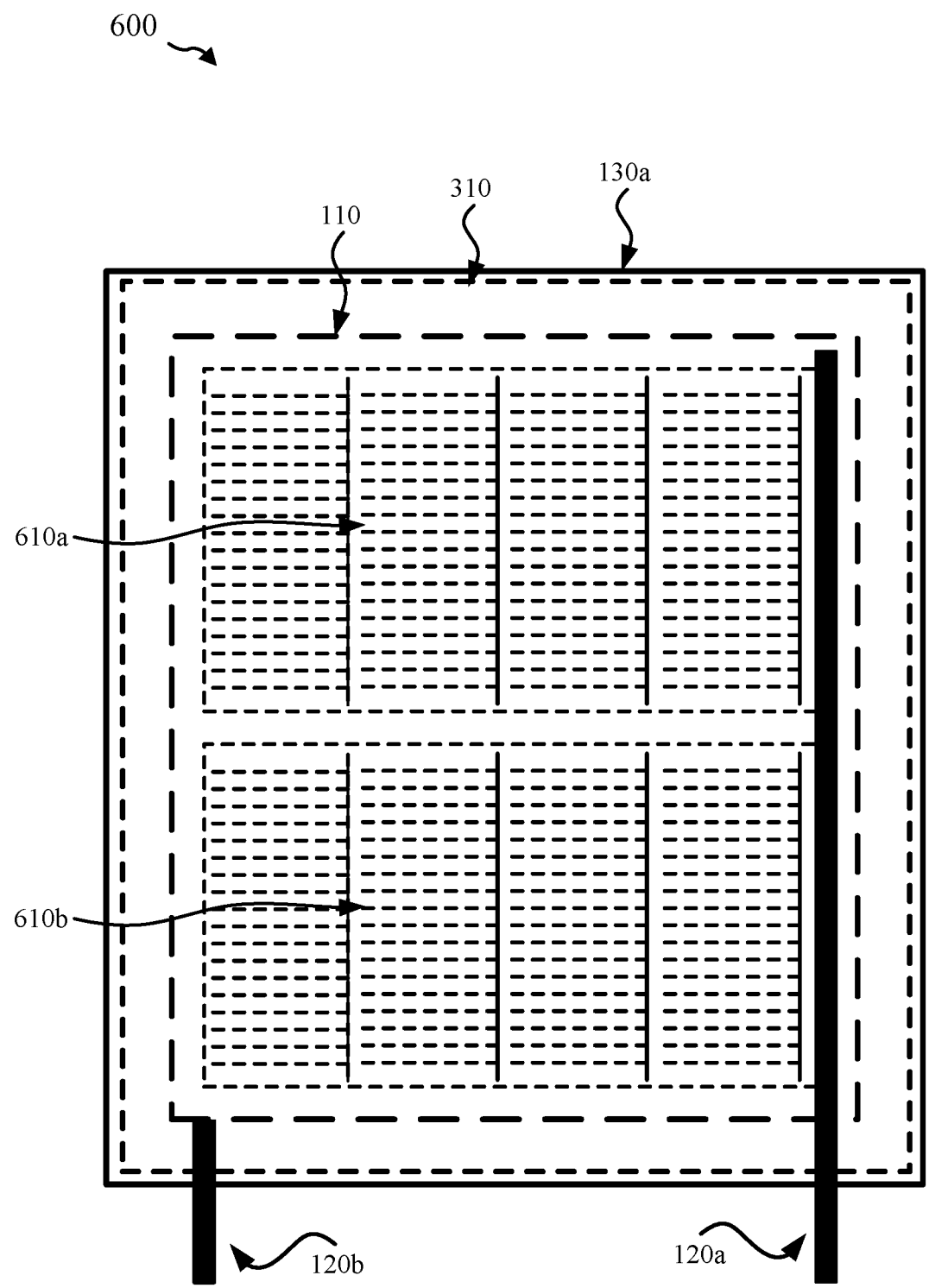
FIG. 6 illustrates an example of a top view of a structure with a planarized PV layer with lamination.

In FIG. 6, a diagram 600 illustrates a top view of a structure or optoelectronic component in which a planarized PV layer has been laminated with protecting layers. In this example, a PV layer 110 is shown to include two PV cells 610a and 610b, although the number of PV cells is merely provided for illustrative purposes and the PV layer 110 can include a larger number of PV cells. Also shown is a protrusion 120a that can correspond to a negative bus, busbar, or contact, and a protrusion 120b that can correspond to a positive bus, busbar, or contact. The PV layer 110 and the protrusions 120a and 120b can be surrounded by the planarization material 310 in the various ways described above to form a planarized PV layer. The planarized PV layer is then protected on one side with the first layer 130a and on the other side (not shown) with the second layer 130b. Details regarding different types of materials that can be used for these protective layers have been described above in connection with the first layer 130a and the second layer 130b. Although not shown, the perimeter of the structure or optoelectronic component in FIG. 6 can be sealed after assembly is complete.

An aspect of the structures or optoelectronic components described above is that they have a flat shape. For example, the protective layers (e.g., the first layer 130a and the second layer 130b) that in a way define the shape of the structure or optoelectronics component are flat. The planarization techniques described herein, however, are not limited to such shapes and instead can apply to different types of shapes since these techniques are intended to address localized surface irregularities (e.g., protrusions, depressions) rather than shape variations over the entire surface of the PV layer. As such, the planarization techniques described herein can also apply to structures or optoelectronic components that have curved and non-uniform shapes.

Figure 7A:
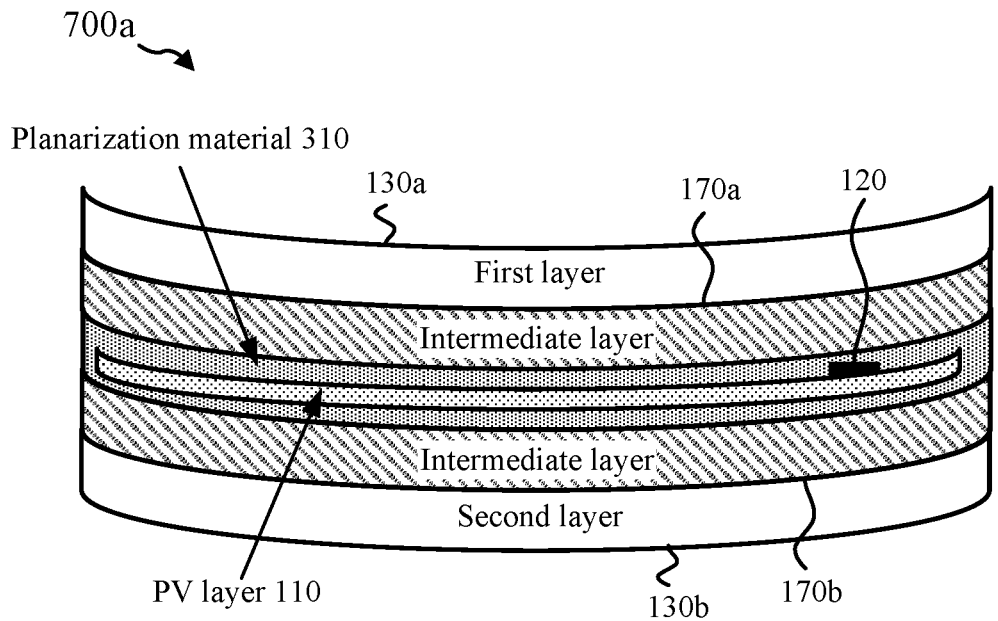
FIGS. 7A and 7B illustrate examples of structures with a planarized PV layer integrated with curved or non-planar lamination.
Figure 7B:
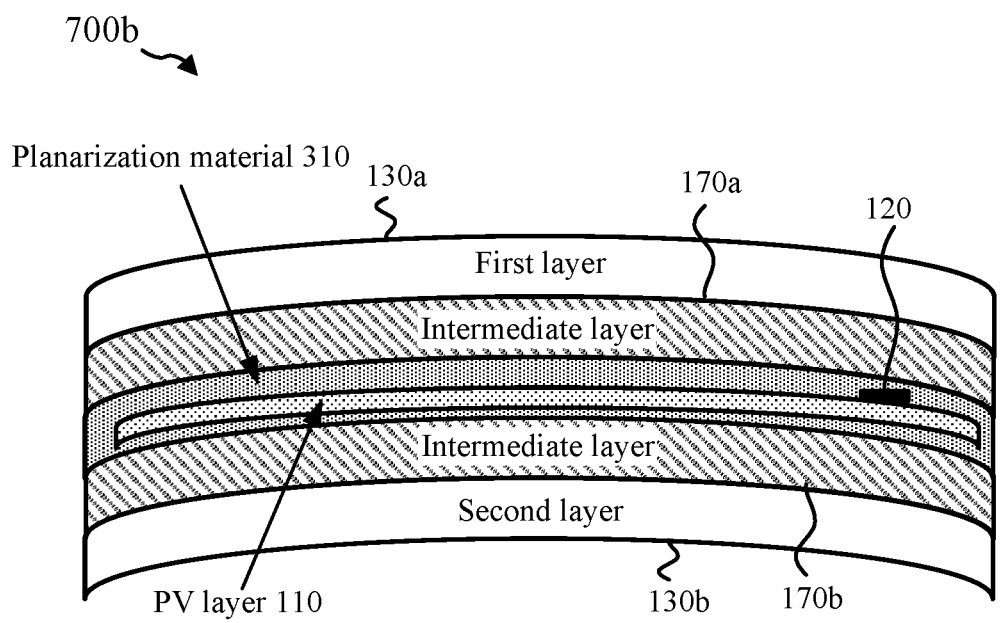

FIG. 7A and FIG. 7B show different structures in which a planarized PV layer is integrated with curved or non-planar lamination. For example, diagrams 700a and 700b of FIG. 7A and FIG. 7B, respectively, show curved structures having a stack of layers that includes the first layer 130a, the intermediate layer 170a, a planarized PV layer having the PV layer 110 with the protrusion 120 surrounded by the planarization material 310, the intermediate layer 170b, and the second layer 130b. This combination of layers is provided for illustrative purposes and other combinations (as described above) can also be used.

In these examples, the first layer 130a and the second layer 130b have curved, complementary shapes, and can be used as part of a lamination process to produce a curved structure or curved optoelectronic component (e.g., curved industrial glass with an embedded PV layer). The planarized PV layer and other layers on the stack can conform to the shapes of the first layer 130a and the second layer 130b as part of the lamination process. The PV layer 110 in the planarized PV layer can be a flexible layer (e.g., thin film layer, layer produced by ELO or similar process).

Figure 8A:
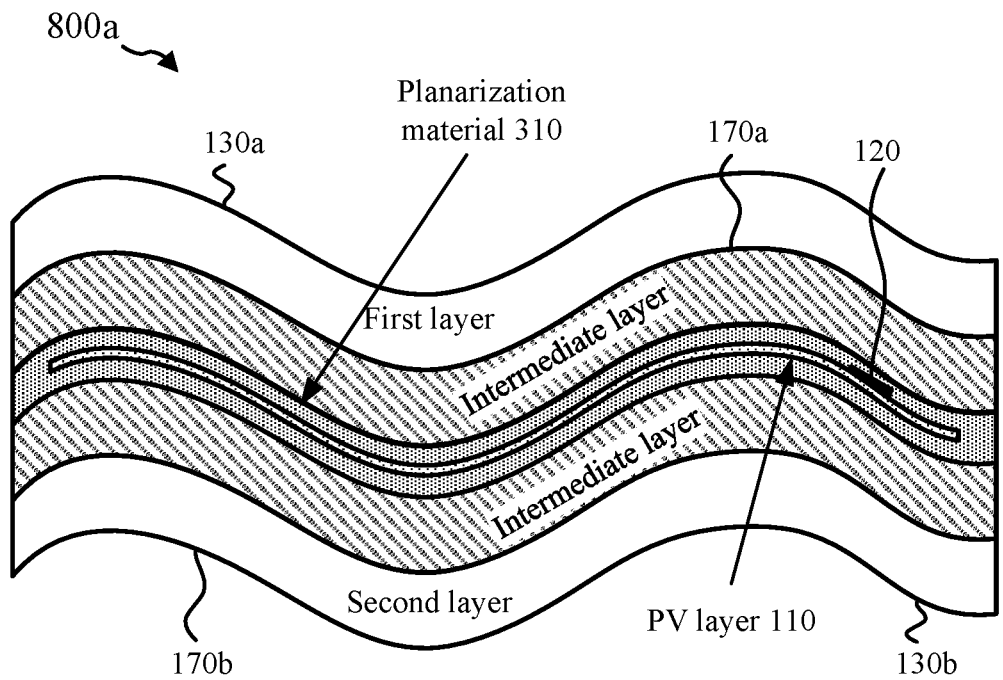
FIG. 8A illustrates an example of a structure with a planarized PV layer integrated with non-uniform lamination.

FIG. 8A shows a structure in which a planarized PV layer is integrated with non-uniform lamination. For example, a diagram 800a of FIG. 8A shows a non-uniform structure (e.g., with multiple curves) having a stack of layers that includes the first layer 130a, the intermediate layer 170a, a planarized PV layer having the PV layer 110 with the protrusion 120 surrounded by the planarization material 310, the intermediate layer 170b, and the second layer 130b. This combination of layers is provided for illustrative purposes and other combinations (as described above) can also be used.

In this example, the first layer 130a and the second layer 130b have non-uniform, complementary shapes, and can be used as part of a lamination process to produce a non-uniform structure or non-uniform optoelectronic component (e.g., a roof tile with an embedded PV layer). The planarized PV layer and other layers on the stack can conform to the shapes of the first layer 130a and the second layer 130b as part of the lamination process. The PV layer 110 in the planarized PV layer can be a flexible layer (e.g., thin film layer, layer produced by ELO or similar process).

Figure 8B:
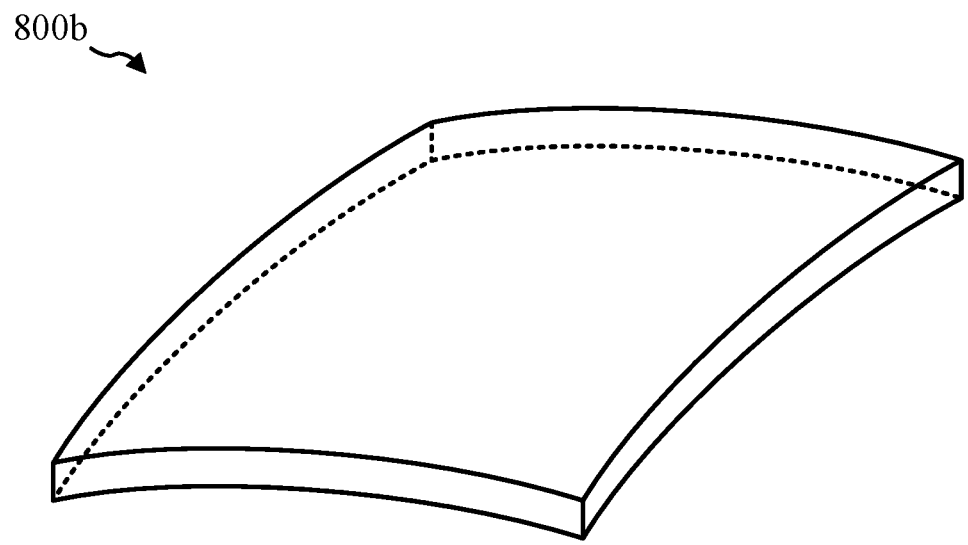
FIG. 8B illustrates an example of a laminated PV layer that curves in multiple directions.

In FIG. 8B, a diagram 800b shows a laminated PV layer that curves in multiple directions. Like the structures or optoelectronic components described above in connection with FIGS. 7A-8A, the laminated PV layer in FIG. 8B can include a stack of layers with a planarized PV layer, where the outer or protective layers (e.g., the first layer 130a and the second layer 130b) of the stack can have a shape that curves in multiple directions to produce a particular industrial solution. The PV layer 110 in the planarized PV layer can be a flexible layer (e.g., thin film layer, layer produced by ELO or similar process).

An aspect of the structures or optoelectronic components described above is that the planarization techniques applied a planarization material to cover an entire surface (or both surfaces) of a PV layer (see e.g., FIG. 5H and FIG. 5I). The planarization techniques described herein, however, are not so limited and the application of the planarization material can be localized since these techniques are intended to address localized surface irregularities (e.g., protrusions, depressions). As such, the planarization techniques described herein can also apply to localized planarization.

Figure 9A:
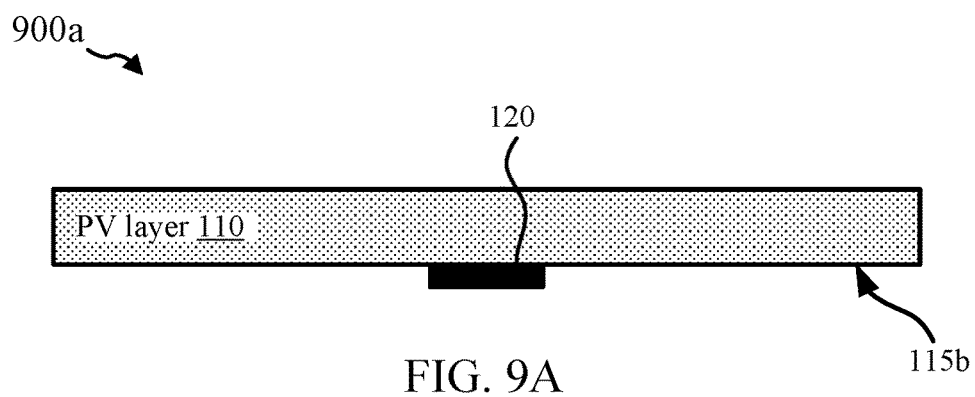
FIGS. 9A-9D illustrate examples of localized planarization for different topographies of PV layers.
Figure 9B:
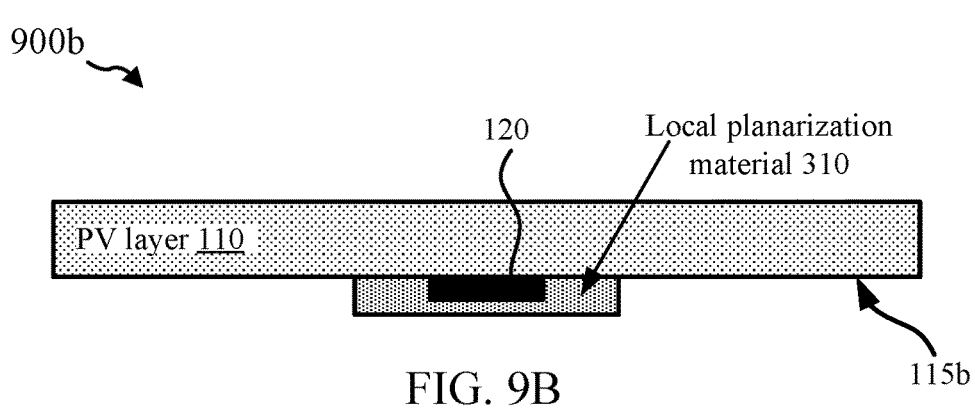

FIGS. 9A-9D provide examples of localized planarization for different topographies of PV layers. In FIG. 9A, a diagram 900a shows the PV layer 110 having the protrusion 120 on the second surface 115b (e.g., on a bottom surface) of the PV layer 110. In FIG. 9B, a diagram 900b shows how the planarization material 310 is applied locally to cover only a small portion of the second surface 115b that surrounds the protrusion 120. In this regard, a single, localized layer of the planarization material 310 can be applied and heated to cover the protrusion 120 and not the entire second surface 115b of the PV layer 110.

Figure 9C:
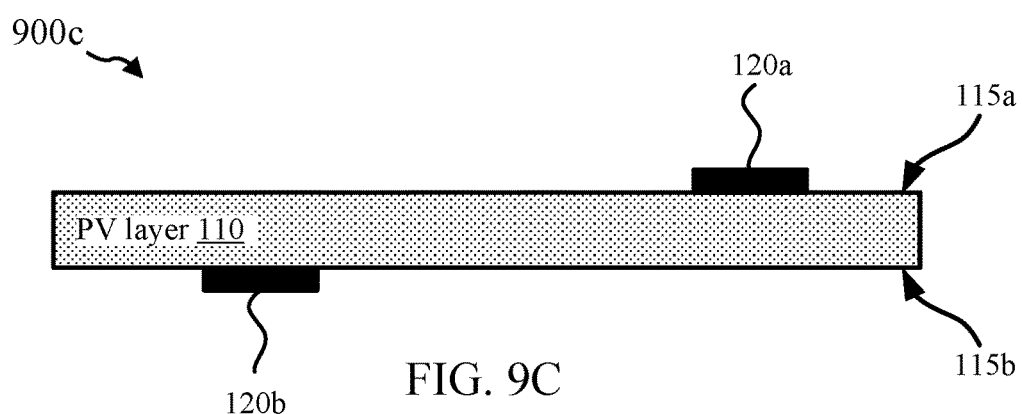
Figure 9D:
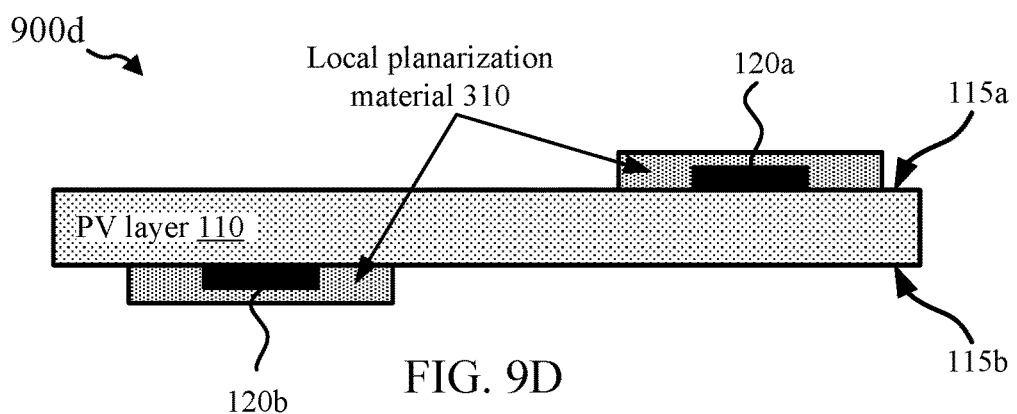

In FIG. 9C, a diagram 900c shows the PV layer 110 having the protrusion 120a on the first surface 115a (e.g., on a top surface) and the protrusion 120b on the second surface 115b (e.g., on a bottom surface) of the PV layer 110. In FIG. 9D, a diagram 900d shows how the planarization material 310 is applied locally to cover only a small portion of the first surface 115a that surrounds the protrusion 120a and only a small portion of the second surface 115b that surrounds the protrusion 120b. In this regard, a single, localized layer of the planarization material 310 can be applied and heated to cover the protrusion 120a and not the entire first surface 115a of the PV layer 110. Similarly for the protrusion 120b and the second surface 115b.

The effect of using a localized planarization technique as described in FIGS. 9A-9D can be similar to that of using a general planarization technique as described above. That is, a localized planarization technique can also reduce the incidence of cracks, defects, and/or shunts produced during certain processes, including autoclave lamination processes, improving overall performance and/or manufacturing yields.

An aspect of the structures or optoelectronic components described above is that the surface irregularities illustrated in most examples mainly concern different types of protrusions on the topography of the PV cell. The planarization techniques described herein, however, are not so limited and the same or similar approaches described above in connection with protrusions can also apply to surface irregularities that include depressions (e.g., whole or partial cavities), protrusions, or a combination of depressions and protrusions on the topography of the PV cell.

Figure 10A:
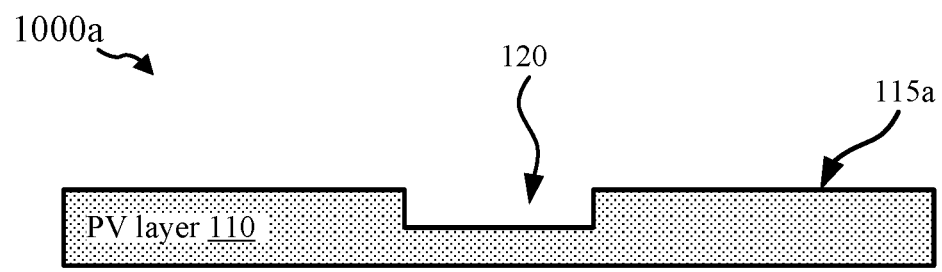
FIGS. 10A-10D illustrate other examples of localized planarization for different topographies of PV layers.
Figure 10B:
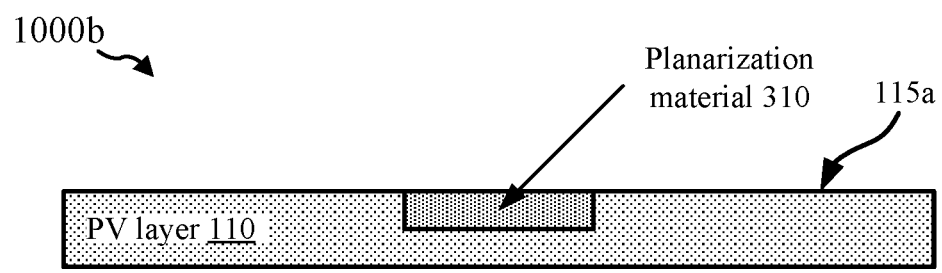

FIGS. 10A-10D illustrate other examples of localized planarization for different topographies of PV layers. In FIG. 10A, a diagram 1000a shows the PV layer 110 having a surface irregularity 120 corresponding to a depression (e.g., surface cavity) on the first surface 115a (e.g., on a top surface) of the PV layer 110. In FIG. 10B, a diagram 1000b shows how the planarization material 310 is applied locally to cover the surface irregularity 120 (e.g., cover the surface cavity) and have the first surface 115a substantially flat. In this regard, a single, localized layer of the planarization material 310 can be applied and heated to cover the depression associated with the surface irregularity 120.

Figure 10C:
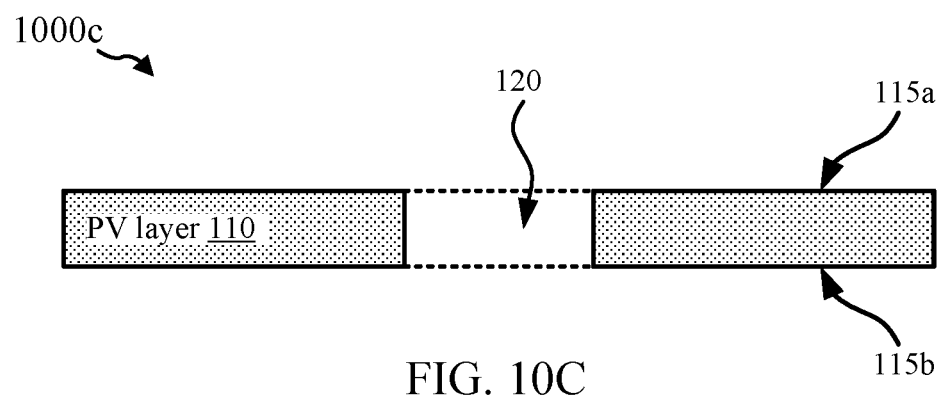
Figure 10D:
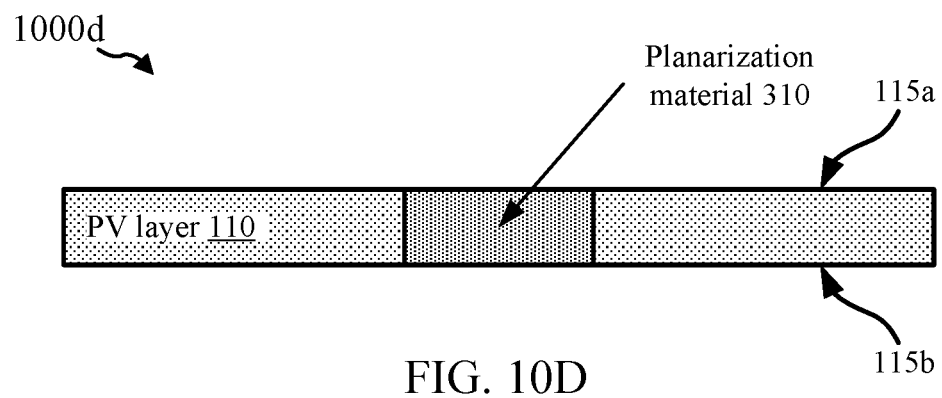

In FIG. 10C, a diagram 1000c shows the PV layer 110 having a surface irregularity 120 corresponding to a depression (e.g., hole, joint, or gap) from the first surface 115a (e.g., a top surface) through to the second surface 115b (e.g., a bottom surface). In FIG. 10D, a diagram 1000d shows how the planarization material 310 is applied locally to cover the surface irregularity 120 (e.g., cover the hole, joint, or gap) and have both the first surface 115a and the second surface 115b substantially flat. In this regard, one or two localized layers of the planarization material 310 can be applied and heated to cover the depression associated with the surface irregularity 120.

The effect of using a localized planarization technique in connection with depressions on a PV layer as described in FIGS. 10A-10D can be similar to that of using a general planarization technique as described above. That is, a localized planarization technique applied to a depression can also reduce the incidence of cracks, defects, and/or shunts produced during certain processes, including autoclave lamination processes, improving overall performance and/or manufacturing yields.

Figure 11:
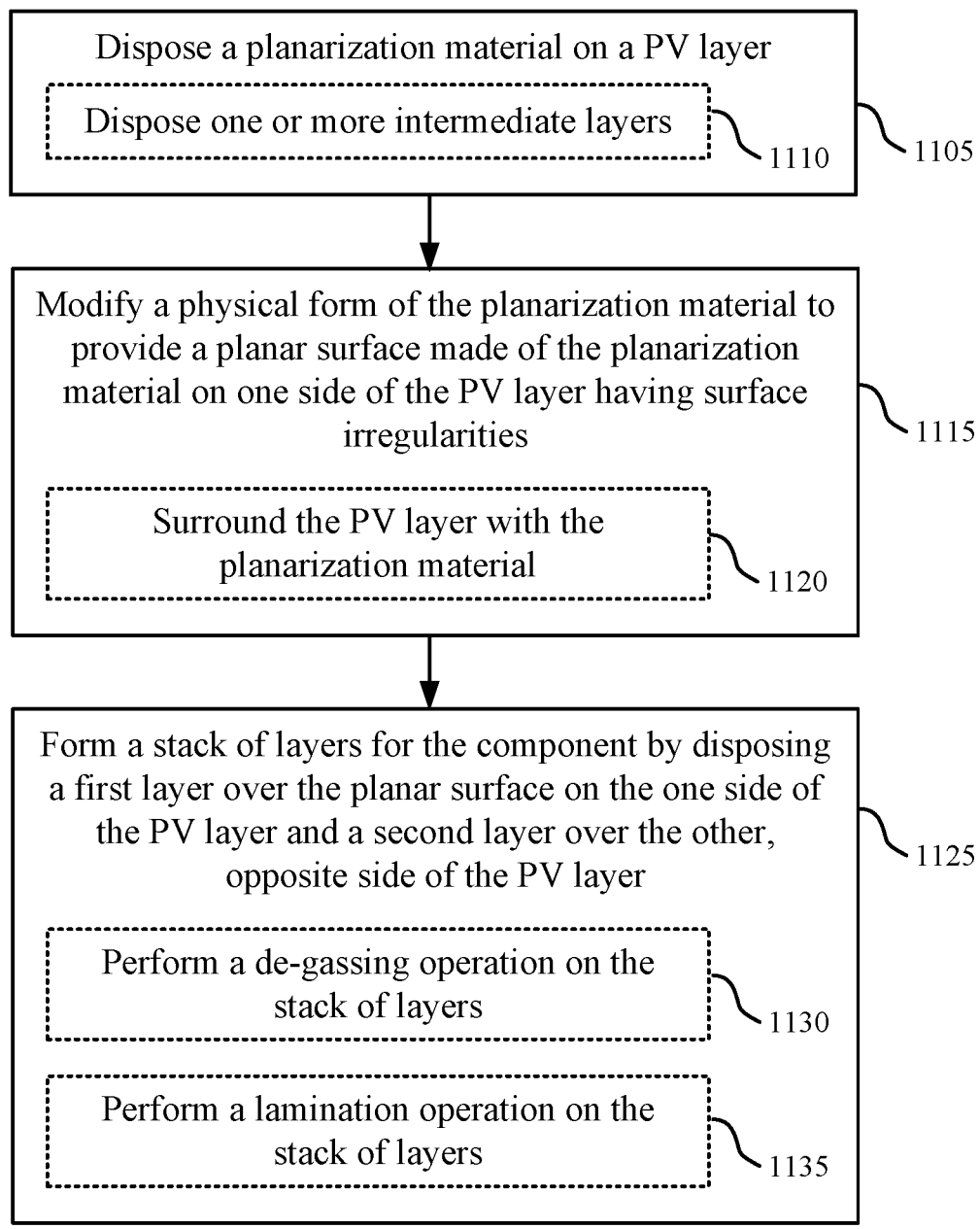
FIG. 11 illustrates an example of a flow diagram of a process for constructing a component with a planarized PV layer.

FIG. 11 shows a flow diagram describing a method or process 1100 for constructing a component (e.g., an optoelectronic component or a light-capturing component) with a planarized PV layer. At 1105, the method 1100 includes disposing a planarization material (e.g., the planarization material 310) on a PV layer (e.g., the PV layer 110). Optionally, and in addition to the planarization material, at 1110, one or more intermediate layers (e.g., the intermediate layer 170a and 170b) can also be disposed.

At 1115, the method 1100 includes modifying a physical form of the planarization material to provide a planar surface made of the planarization material on one side of the PV layer having surface irregularities (e.g., the surface irregularities 120, including protrusions and/or depressions). Optionally, at 1120, the modification of the physical form of the planarization material is such that the planarization material surrounds a portion or all of the PV layer.

At 1125, the method 1100 includes forming a stack of layers for the component by disposing a first layer (e.g., a protective layer, the first layer 130a) over the planar surface on the one side of the PV layer and a second layer (e.g., another protective layer, the second layer 130b) over the other, opposite side of the PV layer. In one option, at 1130, as part of forming the stack of layers, a de-gassing operation may be performed on the stack of layers. In another option, at 1135, as part of forming the stack of layers, a lamination operation may be performed on the stack of layers.

In an aspect of the method 1100, forming the stack of layers is part of performing a process, where the process includes one of an autoclave lamination process, a moving flatbed lamination process, a belt vacuum lamination process, a flat press plate lamination process, a heated nip rollers press process, or a process that combines one or more features from these processes.

In an aspect of the method 1100, forming the stack of layers is part of performing a lamination process in which pressure is applied to the stack of layers.

In an aspect of the method 1100, modifying the physical form of the planarization material to provide the planar surface includes at least partially embedding the PV layer within the planarization material. In one example, at least partially embedding the PV layer within the planarization material includes surrounding at least a surface on the one side of the PV layer with the planarization material. In another example, at least partially embedding the PV layer within the planarization material includes surrounding a first surface on the one side of the PV layer and a second surface on the other side of the PV layer with the planarization material.

In an aspect of the method 1100, modifying the physical form of the planarization material provides another planar surface made of the planarization material on the other side of the PV layer, and forming the stack of layers for the component includes disposing the second layer over the planar surface on the other side of the PV layer.

In an aspect of the method 1100, when performing a de-gassing operation on the stack of layers, the de-gassing operation includes disposing the stack of layers in a vacuum structure that provides a vacuum seal, and reducing pressure within the stack of layers. In an example, the vacuum structure can be a vacuum bag or a vacuum gasket. After the de-gassing operation, or separate from it, a vacuum lamination operation can be performed using a flatbed laminator, a curved mold, or both, wherein the curved mold is based on a shape of the first layer, a shape of the second layer, or both.

In an aspect of the method 1100, when disposing one or more intermediate layers, a first intermediate layer can be disposed between the first layer and the planar surface on the one side of the PV layer, and a second intermediate layer can be disposed between the second layer and the other side of the PV layer, or both. In one example, disposing the first intermediate layer, the second intermediate layer, or both includes disposing a same material as the planarization material. In another example, disposing the first intermediate layer, the second intermediate layer, or both includes disposing a material different from the planarization material.

In an aspect of the method 1100, the one side of the PV layer is a front side of the PV layer for capturing light energy and the other side of the PV layer is a back side of the PV layer. In one example, the first or top surface of the PV layer (e.g., the first surface 115a) can correspond to the front side of the PV layer and the second or bottom surface of the PV layer (e.g., the second surface 115b) can correspond to the back side of the PV layer. In another example, the first or top surface of the PV layer (e.g., the first surface 115a) can correspond to the back side of the PV layer and the second or bottom surface of the PV layer (e.g., the second surface 115b) can correspond to the front side of the PV layer.

In an aspect of the method 1100, disposing the first layer includes disposing one or more of glass or polycarbonate.

In an aspect of the method 1100, disposing the first layer includes disposing one or more of polyethylene terephthalate (PET), polyethylene naphthalate (PEN), ethylene chlorotrifluoroethylene (ECTFE), polychlorotrifluoroethylene (PCTFE), fluorinated ethylene propylene (FEP), or ethylene tetrafluoroethylene (ETFE).

In an aspect of the method 1100, disposing the second layer includes disposing one or more of steel, aluminum, carbon fiber composites, fiber glass, engineering thermoplastics, or reinforced thermoplastics.

In an aspect of the method 1100, disposing the second layer includes disposing thermoplastics, the thermoplastics including at least PET-based backsheets.

In an aspect of the method 1100, the first layer has a first flat shape, the second layer has a second flat shape complementary to the first flat shape, the PV layer with the planarization material is a flexible layer, and a shape of the PV layer with the planarization material conforms to (e.g., takes the shape) the first flat shape and the second flat shape.

In an aspect of the method 1100, the first layer has a first curved shape, the second layer has a second curved shape complementary to the first curved shape, the PV layer with the planarization material is a flexible layer, and a shape of the PV layer with the planarization material conforms to (e.g., takes the shape) the first curved shape and the second curved shape.

In an aspect of the method 1100, the first layer has a first non-uniform shape, the second layer has a second non-uniform shape complementary to the first non-uniform shape, the PV layer with the planarization material is a flexible layer, and a shape of the PV layer with the planarization material conforms to (e.g., takes the shape) the first non-uniform shape and the second non-uniform shape.

In an aspect of the method 1100, the method further includes providing as the PV layer a thin film PV material. In an example, the thin film PV material includes one or more of cadmium telluride (CdTe), copper indium gallium diselenide (CIGS), amorphous thin-film silicon (a-Si), gallium arsenide (GaAs), or perovskite.

In an aspect of the method 1100, the PV layer includes crystalline silicon (c-Si) made of multicrystalline silicon or monocrystalline silicon.

In an aspect of the method 1100, the PV layer includes a heterojunction with intrinsic thin layer (HIT) structure having a thin crystalline silicon layer surrounded by one or more ultra-thin amorphous silicon layers.

In an aspect of the method 1100, the PV layer includes one or more solar cells or PV cells (e.g., PV cells 610a, 610b) in electrical communication, or one or more solar modules in electrical communication.

In an aspect of the method 1100, the surface irregularities include one or more protrusions, one or more depressions, or a combination of both. In an example, the one or more protrusions include a busbar, a tab, or a contact. In another example, the one or more depressions include a surface cavity, a joint, gap, or hole. In another aspect, the surface irregularities include one or more gaps between solar cells in the PV layer.

Each of the features described above in connection with the figures and the method 1100 can be implemented individually or in some combination for planarizing a PV layer and processing the planarized PV layer to fabricate, assembly, or manufacture an optoelectronic component or structure that is free, or relatively free, of cracks, defects, and/or shunts.

The above description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe certain principles and practical applications, thereby enabling others skilled in the relevant art to understand the subject matter, the various embodiments and the various modifications that are suited to the particular uses contemplated.

Although the above Detailed Description describes certain embodiments and the best mode contemplated, no matter how detailed the above appears in text, the embodiments can be practiced in many ways. Details of the systems and methods may vary considerably in their implementation details while still being encompassed by the specification. As noted above, particular terminology used when describing certain features or aspects of various embodiments should not be taken to imply that the terminology is being redefined herein to be restricted to any specific characteristics, features, or aspects of the disclosed technique with which that terminology is associated. In general, the terms used in the following claims should not be construed to limit the disclosure to the specific embodiments disclosed in the specification, unless those terms are explicitly defined herein. Accordingly, the actual scope of the technique encompasses not only the disclosed embodiments but also all equivalent ways of practicing or implementing the embodiments under the claims.

The language used in the specification has been principally selected for readability and instructional purposes, and it may not have been selected to delineate or circumscribe the inventive subject matter. It is therefore intended that the scope of the technique be limited not by this Detailed Description, but rather by any claims that issue on an application based hereon. Accordingly, the disclosure of various embodiments is intended to be illustrative, but not limiting, of the scope of the embodiments, which is set forth in the following claims.

From the foregoing, it will be appreciated that specific embodiments of the invention have been described herein for purposes of illustration, but that various modifications may be made without deviating from the scope of the invention. Accordingly, the invention is not limited except as by the appended claims.

What is claimed is:

1. A method for producing a component, comprising:
disposing a planarization material on a photovoltaic (PV) layer;
modifying a physical form of the planarization material to provide a planar surface made of the planarization material on one side of the PV layer having surface irregularities;
forming a stack of layers for the component by disposing a first layer over the planar surface on the one side of the PV layer and a second layer over the other, opposite side of the PV layer;
performing a de-gassing operation on the stack of layers; and
performing a vacuum lamination operation on the stack of layers following the de-gassing operation.

2. The method of claim 1, wherein forming the stack of layers is part of performing a process, the process including one of:
an autoclave lamination process,
a moving flatbed lamination process,
a belt vacuum lamination process,
a flat press plate lamination process, or
a heated nip rollers press process.

3. The method of claim 1, wherein forming the stack of layers is part of performing a lamination process in which pressure is applied to the stack of layers.

4. The method of claim 1, wherein modifying the physical form of the planarization material to provide the planar surface includes at least partially embedding the PV layer within the planarization material.

5. The method of claim 4, wherein:
at least partially embedding the PV layer within the planarization material includes surrounding at least a surface on the one side of the PV layer with the planarization material, or
at least partially embedding the PV layer within the planarization material includes surrounding a first surface on the one side of the PV layer and a second surface on the other side of the PV layer with the planarization material.

6. The method of claim 1, wherein:
modifying the physical form of the planarization material provides another planar surface made of the planarization material on the other side of the PV layer; and
forming the stack of layers for the component includes disposing the second layer over the planar surface on the other side of the PV layer.

7. The method of claim 1, wherein the de-gassing operation comprises:
disposing the stack of layers in a vacuum structure that provides a vacuum seal, the vacuum structure being a vacuum bag or a vacuum gasket; and
reducing pressure within the stack of layers.

8. The method of claim 7, wherein the vacuum lamination is performed using a flatbed laminator, a curved mold, or both, wherein the curved mold is based on a shape of the first layer, a shape of the second layer, or both.

9. The method of claim 1, further comprising disposing a first intermediate layer between the first layer and the planar surface on the one side of the PV layer, a second intermediate layer between the second layer and the other side of the PV layer, or both.

10. The method of claim 9, wherein:
disposing the first intermediate layer, the second intermediate layer, or both includes disposing a same material as the planarization material, or
disposing the first intermediate layer, the second intermediate layer, or both includes disposing a material different from the planarization material.

11. The method of claim 1, wherein the one side of the PV layer is a front side of the PV layer for capturing light energy and the other side of the PV layer is a back side of the PV layer.

12. The method of claim 1, wherein:
disposing the first layer includes disposing one or more of glass or polycarbonate, or
disposing the first layer includes disposing one or more of polyethylene terephthalate (PET), polyethylene naphthalate (PEN), ethylenechlorotrifluoroethylene (ECTFE), polychlorotrifluoroethylene (PCTFE), fluorinated ethylene propylene (FEP), or ethylene tetrafluoroethylene (ETFE).

13. The method of claim 1, wherein:
disposing the second layer includes disposing one or more of steel, aluminum, carbon fiber composites, fiber glass, engineering thermoplastics, or reinforced thermoplastics, or
disposing the second layer includes disposing thermoplastics, the thermoplastics including at least PET-based backsheets.

14. The method of claim 1, wherein:
the first layer has a first flat shape,
the second layer has a second flat shape complementary to the first flat shape, and
the PV layer with the planarization material is a flexible layer,
the method further comprising conforming a shape of the PV layer with the planarization material to the first flat shape and the second flat shape.

15. The method of claim 1, wherein:
the first layer has a first curved shape or a first non-uniform shape,
the second layer has a second curved shape complementary to the first curved shape or a second non-uniform shape complementary to the first non-uniform shape, and
the PV layer with the planarization material is a flexible layer,
the method further comprising conforming a shape of the PV layer with the planarization material to the first curved shape and the second curved shape or to the first non-uniform shape and the second non-uniform shape.

16. The method of claim 1, further comprising providing as the PV layer a thin film PV material, wherein the thin film PV material includes one or more of cadmium telluride (CdTe), copper indium gallium diselenide (CIGS), amorphous thin-film silicon (a-Si), gallium arsenide (GaAs), or perovskite.

17. The method of claim 1, wherein:
the PV layer includes crystalline silicon (c-Si) made of multicrystalline silicon or monocrystalline silicon,
the PV layer includes a heterojunction with intrinsic thin layer (HIT) structure having a thin crystalline silicon layer surrounded by one or more ultra-thin amorphous silicon layers, or
the PV layer includes one or more solar cells in electrical communication, or one or more solar modules in electrical communication.

18. The method of claim 1, wherein the surface irregularities include one or more protrusions, wherein the one or more protrusions include a busbar, a tab, or a contact.

19. The method of claim 1, wherein the surface irregularities include one or more gaps between solar cells in the PV layer.

20. The method of claim 1, wherein the planarization material includes one or more of a thermoplastic or a thermoset.

* * * * *